US012655524B2

(12) United States Patent
Xiao et al.

(10) Patent No.: US 12,655,524 B2
(45) Date of Patent: Jun. 16, 2026

(54) MONOALKOXYSILANES AND DIALKOXYSILANES AND DENSE ORGANOSILICA FILMS MADE THEREFROM

(71) Applicant: VERSUM MATERIALS US, LLC, Tempe, AZ (US)

(72) Inventors: Manchao Xiao, San Diego, CA (US); William Robert Entley, Gilbert, AZ (US); Daniel P. Spence, Carlsbad, CA (US); Raymond Nicholas Vrtis, Carlsbad, CA (US); Jennifer Lynn Anne Achtyl, Chandler, AZ (US); Robert Gordon Ridgeway, Chandler, AZ (US); Xinjian Lei, Vista, CA (US)

(73) Assignee: Versum Materials US, LLC, Tempe, AZ (US)

(*) Notice: Subject to any disclaimer, the term of this patent is extended or adjusted under 35 U.S.C. 154(b) by 288 days.

(21) Appl. No.: 17/641,792

(22) PCT Filed: Sep. 11, 2020

(86) PCT No.: PCT/US2020/050283
§ 371 (c)(1),
(2) Date: Mar. 9, 2022

(87) PCT Pub. No.: WO2021/050798
PCT Pub. Date: Mar. 18, 2021

(65) Prior Publication Data

US 2024/0052490 A1 Feb. 15, 2024

Related U.S. Application Data

(60) Provisional application No. 62/899,807, filed on Sep. 13, 2019.

(51) Int. Cl.
*B05D 1/00* (2006.01)
*C23C 16/40* (2006.01)
(Continued)

(52) U.S. Cl.
CPC ................ *C23C 16/50* (2013.01); *B05D 1/62* (2013.01); *C23C 16/402* (2013.01); *C23C 16/4414* (2013.01)

(58) Field of Classification Search
None
See application file for complete search history.

(56) References Cited

U.S. PATENT DOCUMENTS

| | | | |
|---|---|---|---|
| 6,583,049 | B2 | 6/2003 | Masayuki |
| 9,922,818 | B2 | 3/2018 | Vrtis et al. |

(Continued)

FOREIGN PATENT DOCUMENTS

| | | | |
|---|---|---|---|
| CN | 101575700 | A | 11/2009 |
| CN | 102308020 | A | 1/2012 |

(Continued)

OTHER PUBLICATIONS

Grill, A. "PECVD low and Ultralow Dielectric Constant Materials: From Invention and Research to Products" J. Vac. Sci. Technol. B, 2016, 34, 020801-1-020801-4.

(Continued)

*Primary Examiner* — Shamim Ahmed
*Assistant Examiner* — Bradford M Gates
(74) *Attorney, Agent, or Firm* — Versum Materials US, LLC; David K. Benson

(57) ABSTRACT

A method for making a dense organosilicon film with improved mechanical properties, the method comprising the steps of: providing a substrate within a reaction chamber; introducing into the reaction chamber a gaseous composition comprising a novel mono- or dialkoxysilane; and applying
(Continued)

energy to the gaseous composition comprising the novel mono- or dialkoxysilane in the reaction chamber to induce reaction of the gaseous composition comprising the novel mono- or dialkoxysilane to deposit an organosilicon film on the substrate, wherein the organosilicon film has a dielectric constant of from about 2.8 to about 3.3, an elastic modulus of from about 7 to about 30 GPa, and an at. % carbon of from about 10 to about 30 as measured by XPS.

15 Claims, 10 Drawing Sheets

(51) Int. Cl.

| | |
|---|---|
| ***C23C 16/44*** | (2006.01) |
| ***C23C 16/50*** | (2006.01) |

(56) References Cited

U.S. PATENT DOCUMENTS

| | | | |
|---|---|---|---|
| 2003/0232137 | A1 | 12/2003 | Vrtis et al. |
| 2004/0197474 | A1 | 10/2004 | Vrtis et al. |
| 2006/0078676 | A1 | 4/2006 | Lukas |
| 2008/0268177 | A1 | 10/2008 | Vrtis et al. |
| 2010/0137626 | A1 | 6/2010 | Hamada |
| 2011/0111318 | A1 | 5/2011 | Bernard et al. |
| 2011/0206857 | A1 | 8/2011 | Yim et al. |
| 2011/0313184 | A1 | 12/2011 | Tajima |
| 2013/0060061 | A1 | 3/2013 | Mayorga |
| 2013/0260575 | A1 | 10/2013 | Al-Rashid et al. |
| 2015/0364321 | A1 | 12/2015 | Vrtis et al. |
| 2015/0368803 | A1 | 12/2015 | Yim et al. |
| 2015/0380265 | A1* | 12/2015 | Yim .................. H01L 21/02211 438/780 |
| 2016/0049293 | A1 | 2/2016 | Li et al. |
| 2018/0047898 | A1 | 2/2018 | Ridgeway et al. |
| 2019/0134663 | A1 | 5/2019 | Lei |
| 2019/0244810 | A1 | 8/2019 | Vrtis |

FOREIGN PATENT DOCUMENTS

| | | | |
|---|---|---|---|
| EP | 1225194 | A2 | 7/2002 |
| JP | 2002-256434 | A | 9/2002 |
| JP | 2004-006822 | A | 1/2004 |
| JP | 2006100833 | A | 4/2006 |
| JP | 2009-272632 | A | 11/2009 |
| JP | 2010157689 | A | 7/2010 |
| JP | 2016-005001 | A | 1/2016 |
| JP | 2019081951 | A | 5/2019 |
| KR | 10-0447684 | B1 | 9/2004 |
| TW | 200806684 | A | 2/2008 |
| TW | 200946710 | A | 11/2009 |
| TW | 201035365 | A | 10/2010 |
| TW | 201239127 | A | 10/2012 |
| TW | 201343952 | A | 11/2013 |
| TW | 201448036 | A | 12/2014 |
| TW | 201934562 | A | 9/2019 |
| WO | 2016144960 | A1 | 9/2016 |
| WO | 2021/050798 | A1 | 3/2021 |

OTHER PUBLICATIONS

Baklanov, M. R. et al. "Plasma Processing of Low-k Dielectrics" J. Appl. Phys. 2013, 113, 041101-1-041101-41.

Priyadarshini, D.; Nguyen, S. V.; Shobha, H.; Liniger, E., Chen, J. H.-C.; Huang, H.; Cohen, S. A.; Grill, A. "Advanced Single Precursor Based pSiOCH k=2.4 for ULSI Interconnects" J. Vac. Sci. Technol. B 2017, 35, 021201-021201-6).

"Invitation to Respond to Written Opinion received for Singapore Application No. 11202202439U, mailing date Feb. 16, 2024", 8 Pages.

"Extended European Search Report received for European Patent Application No. 20862141.7 mailing date Jun. 26, 2023", 8 Pages.

"International Preliminary Report on Patentability received for PCT Application No. PCT/US2020/050283, mailing date Mar. 24, 2022", 8 Pages.

"International Search Report and Written Opinion received for PCT Application No. PCT/US2020/050283, mailing date Dec. 15, 2020", 10 Pages.

* cited by examiner

MONOALKOXYSILANES AND DIALKOXYSILANES AND DENSE ORGANOSILICA FILMS MADE THEREFROM

CROSS-REFERENCE TO RELATED APPLICATIONS

This application is a 371 U.S. National entry of International Application PCT/US2020/050283 filed on Sep. 11, 2020, which claims benefit of U.S. Provisional Application No. 62/899,807 filed on Sep. 13, 2019. The disclosure of those applications is hereby incorporated by reference in their entirety.

BACKGROUND OF THE INVENTION

Described herein is a composition and method for formation of a dense organosilica dielectric film using a mono- or dialkoxysilane as a precursor to the film. More specifically, described herein is a composition and chemical vapor deposition (CVD) method for forming a dense film having a dielectric constant, k≥2.7, wherein the film has a high elastic modulus and excellent resistance to plasma induced damage as compared to films made from conventional precursors.

The electronics industry utilizes dielectric materials as insulating layers between circuits and components of integrated circuits (IC) and associated electronic devices. Line dimensions are being reduced to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.7 to about 3.5. This organosilica glass is typically deposited as a dense film (density about 1.5 g/cm$^3$) from an organosilicon precursor, such as a methylsilane or siloxane, and an oxidant, such as $O_2$ or $N_2O$. Organosilica glass will be herein be referred to as OSG.

US Publication US201110113184A discloses a class of materials that can be used to deposit insulating films with dielectric constants ranging from about k=2.4 to k=2.8 via a PECVD process. The materials comprise Si compounds that have 2 hydrocarbon groups that can be bound to each other to form a cyclic structure in cooperation with a Si atom or having ≥1 branched hydrocarbon group. In the branched hydrocarbon group, an α-C which is a C atom bound to a Si atom constitutes a methylene group, and a β-C which is a C atom bound to the methylene group or a γ-C which is a C atom bound to the β-C is the branching point. Specifically two of the alkyl groups bonded to the Si include $CH_2CH(CH_3)CH_3$, $CH_2CH(CH_3)CH_2CH_3$, $CH_2CH_2CH(CH_3)CH_3$, $CH_2C(CH_3)_2CH_3$ and $CH_2CH_2CH(CH_3)_2CH_3$, and a third group bonded to the silicon includes $OCH_3$ and $OC_2H_5$. Although this invention claims that a high density of $SiCH_2Si$ groups forms within the as deposited film via plasma dissociation of the alkyl group R from $SiCH_2R$, the examples in the patent application indicates that a high density of $SiCH_2Si$ groups only occurs after the films are exposed to ultraviolet irradiation. The formation of $SiCH_2Si$ groups upon exposure to ultraviolet irradiation has been well documented in the literature (Grill, A. "PECVD low and Ultralow Dielectric Constant Materials: From Invention and Research to Products" *J. Vac. Sci. Technol. B,* 2016, 34, 020801-1-020801-4; Baklanov, M. R. et al. "Plasma Processing of Low-k Dielectrics" *J. Appl. Phys.* 2013, 113, 041101-1-041101-41; Priyadarshini, D.; Nguyen, S. V.; Shobha, H.; Liniger, E., Chen, J. H.-C.; Huang, H.; Cohen, S. A.; Grill, A. "Advanced Single Precursor Based pSiOCH k=2.4 for ULSI Interconnects" *J. Vac. Sci. Technol. B* 2017, 35, 021201-021201-6).

There are several other disadvantages to the approach disclosed US Publication US201110113184A. First is the requirement for large alkyl groups that include a branched alkyl group in the precursor structure. Such molecules are expensive to synthesize and, because of their inherently high molecular weight, typically have high boiling points and low volatility. A high boiling point and low volatility make it challenging to effectively deliver such molecules in the vapor phase, as required for PECVD processes. Perhaps most importantly, the values of the dielectric constant reported in this approach are low, less than or equal to 2.8. It is well established that the lowest dielectric constant achievable for a dense low k films with reasonable mechanical properties is approximately 2.7 to 2.8. Thus, the approach disclosed US Publication US201110113184A is not related to the deposition of dense low k films in the absence of post deposition processing (i.e., UV curing), but is more akin to a tethered porogen approach for generating porous low k films.

Plasma or process induced damage (PID) in low k films is caused by the removal of carbon from the film during plasma exposure, particularly during etch and photoresist strip processes. Carbon depletion in the low k films can cause one or more of the following problems: an increase in the dielectric constant of the film; film etching and feature bowing (i.e, profile erosion) during wet cleaning steps; moisture absorption into the film due to loss of hydrophobicity; pattern collapse of fine features during the wet clean steps after pattern etch and/or integration issues when depositing subsequent layers such as, without limitation, cupper diffusion barriers, for example Ta/TaN or advanced Co or MnN barrier layers. Thus, process induced damage in low k films is a significant problem that device manufacturers must overcome when integrating low k materials in a ULSI interconnect. Films with increased mechanical properties (higher elastic modulus, higher hardness) reduce line edge roughness in patterned features, reduce pattern collapse, and provide greater internal mechanical stress within an interconnect, reducing failures due to electromigration. Thus, there is a need for low k films with strong resistance to PID and the highest possible mechanical properties at a given dielectric constant. Further, there is a need for these films to be deposited without the need for post deposition treatment, such as UV curing, as UV curing will decrease throughput in a high volume manufacturing environment, add cost and complexity to the process, decrease the carbon content of the film (increasing the depth of PID), and increase the porosity of the film (increasing the depth of PID). That is, the as deposited film properties should be acceptable without the need for post deposition treatments such as UV curing.

BRIEF SUMMARY OF THE INVENTION

The method and composition described herein fulfill one or more needs described above. The mono- or dialkoxysilane precursor can be used to deposit dense low k films with k valves between about 2.80 to about 3.30. While both the mono- and dialkoxysilane precursors described in this invention result in films with unexpectedly high mechanical properties, the dialkoxysilane precursors result in films with the highest possible mechanical properties and the mono-alkoxysilane precursors result in films that exhibit an unexpectedly high elastic modulus/hardness and are expected to exhibit an unexpectedly high resistance to plasma induced damage at a given value of the dielectric constant. The film properties are observed for the as deposited films, although post deposition treatments, such as UV curing, can be used to further increase the mechanical properties of the film.

In one aspect, the disclosure provides a method for making a dense organosilica film (or low k) with improved mechanical properties, the method comprising the steps of: providing a substrate within a reaction chamber; introducing into the reaction chamber a gaseous composition comprising mono- or dialkoxysilane having the structure of given in Formula (1) and (2):

$$HR^1R^2SiOR^3 \quad (1)$$

wherein $R^1$ is methyl, $R^2$ is selected from a branched or cyclic $C_3$ to $C_{10}$ alkyl, preferably iso-propyl, sec-butyl, or tert-butyl, and $R^3$ is selected from a linear, branched or cyclic $C_1$ to $C_{10}$ alkyl, preferably methyl, ethyl, propyl, iso-propyl, butyl, sec-butyl, iso-butyl, or tert-butyl;

$$R^4R^5Si(OR^6)_2 \quad (2)$$

wherein $R^4$ is hydrogen or methyl, $R^5$ is selected from a linear, branched or cyclic $C_1$ to $C_{10}$ alkyl, preferably iso-propyl or tert-butyl, and $R^6$ is selected from a linear, branched or cyclic $C_3$ to $C_{10}$ alkyl, preferably propyl, iso-propyl, butyl, sec-butyl, iso-butyl, or tert-butyl.

For the above Formula combinations of alkyl groups are selected such that the molecule's boiling point is less than 200° C. In addition, for optimum performance R groups may be chosen that form secondary or tertiary radicals upon homolytic bond dissociation (e.g., SiO—R→SiO·+R·, or Si—R→Si·+R·, wherein R· is a secondary or tertiary radical such as an isopropyl radical, sec-butyl radical, or a tert-butyl radical); and applying energy to the gaseous composition comprising mono- or dialkoxysilane in the reaction chamber to induce reaction of the gaseous composition comprising mono- or dialkoxysilane to deposit an organosilicon film on the substrate, wherein the organosilica film has a dielectric constant of from about 2.8 to about 3.3 and an elastic modulus of from about 7 to about 30 GPa.

In another aspect, the disclosure provides a method for making a dense organosilica film with improved mechanical properties, the method comprising the steps of: providing a substrate within a reaction chamber; introducing into the reaction chamber a gaseous composition comprising mono- or dialkoxysilane; and applying energy to the gaseous composition comprising mono- or dialkoxysilane in the reaction chamber to induce reaction of the gaseous composition comprising mono- or dialkoxysilane to deposit an organosilica film on the substrate, wherein the organosilica film has a dielectric constant of from about 2.8 to about 3.3, an elastic modulus of from about 7 to about 30 GPa, and an at. % carbon of from about 10 to about 30 as measured by XPS.

DETAILED DESCRIPTION OF THE INVENTION

Figure 1:
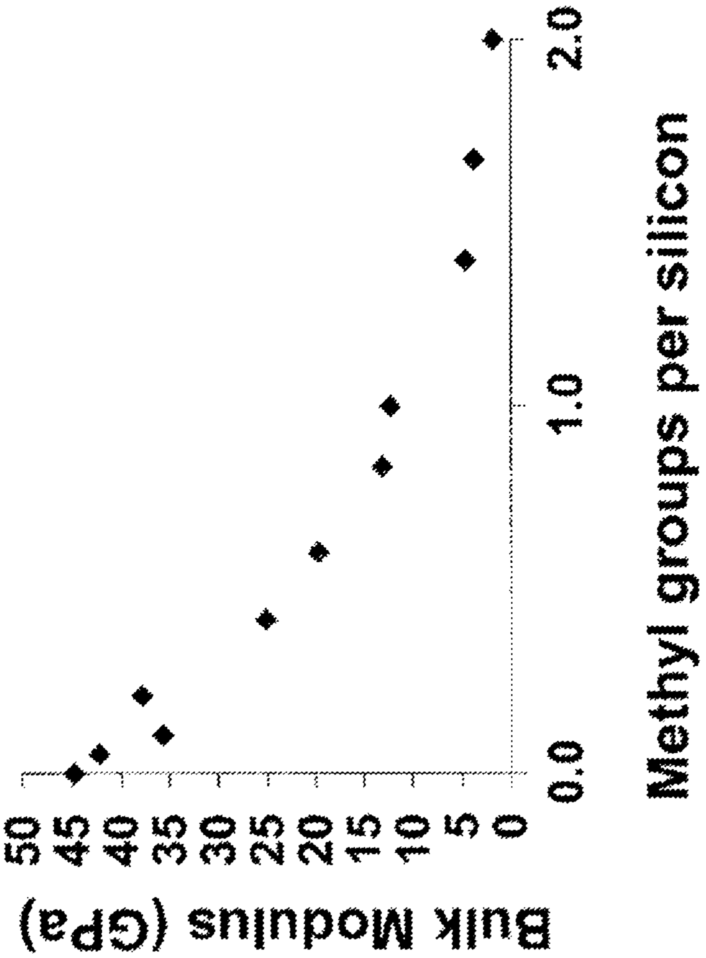
FIG. 1 is a graph depicting a relationship between the % Si-Me groups in a thin film versus mechanical strength.

Described herein is a chemical vapor deposition method for making a dense organosilica film with improved mechanical properties, the method comprising the steps of: providing a substrate within a reaction chamber; introducing into the reaction chamber a gaseous composition comprising a mono- or dialkoxysilane, a gaseous oxidant such as $O_2$ or $N_2O$, and an inert gas such as He; and applying energy to the gaseous composition comprising mono- or dialkoxysilane in the reaction chamber to induce reaction of the gaseous composition comprising mono- or dialkoxysilane to deposit an organosilica film on the substrate, wherein the organosilica film has a dielectric constant of from about 2.7 to about 3.3, an elastic modulus of from about 7 to about 30 GPa, and an at. % carbon of from about 10 to about 30 as measured by XPS, preferably a dielectric constant of from about 2.9 to about 3.2, an elastic modulus of from about 9 to about 30 GPa, and an at. % carbon from about 10 to about 25 as measured by XPS.

Also described herein is a method for making a dense organosilica film with improved mechanical properties, the method comprising the steps of: providing a substrate within a reaction chamber; introducing into the reaction chamber a gaseous composition comprising mono- or dialkoxysilane, a gaseous oxidant such as $O_2$ or $N_2O$, and an inert gas such as He; and applying energy to the gaseous composition comprising mono- or dialkoxysilane to deposit an organosilica film on the substrate, wherein the organosilica film has a dielectric constant of from about 3.0 to about 3.2 and an elastic modulus of from about 12 to about 30 GPa.

The mono- or dialkoxysilane compounds described in this invention provide unique attributes that make it possible to achieve a dense organosilica film and to surprisingly exhibit unexpectedly high mechanical properties at a given value of the dielectric constant between about 2.7 to about 3.3, compared to prior art structure former precursors such as diethoxymethylsilane (DEMS®) and dimethoxy-dimethylsilane (DMDMOS). Not bound by theory, it is believed that the mono- or dialkoxysilanes described in this invention can provide stable radicals such as $(CH_3)_2CH\cdot$ and $(CH_3)_3C\cdot$ during plasma enhanced chemical vapor deposition. Such radicals are more stable compared to methyl radicals as disclosed in the prior art such as $Me_3SiOMe$ or $Me_3SiOEt$ (Bayer, C., et al. "Overall Kinetics of SiOx Remote-PECVD using Different Organosilicon Monomers," 116-119 Surf. Coat. Technol. 874 (1999)). The higher density of stable radicals such as $(CH_3)_2CH\cdot$ and $(CH_3)_3C\cdot$ in the plasma increase the probability of reaction with the terminal silicon methyl groups in compounds of Formula (1) or compounds of Formula (2). This reduces the density of the terminal silicon methyl groups in the film, resulting in higher mechanical properties. It is also recognized that a higher density of stable radicals in the plasma may be achieved when the alkyl group bonded directly to the silicon atom is selected from a branched or cyclic alkyl, such as isopropyl, sec-butyl, t-butyl, or cyclohexyl.

It is well known in organic chemistry that more energy must be supplied to generate a primary carbon radical (such as an ethyl radical, $CH_3CH_2\cdot$) than a secondary carbon radical (such as an isopropyl radical $(CH_3)_2CH\cdot$). This is due to the greater stability of the isopropyl radical relative to the ethyl radical. The same principle applies to the homolytic bond dissociation of the oxygen-carbon bond in silicon alkoxy groups; it requires less energy to dissociate the oxygen-carbon bond in an isopropoxysilane than in an ethoxysilane. Similarly, it takes less energy to dissociate the silicon-carbon bond in an isopropylsilane than in an ethylsilane. Not to be bound by theory, it is assumed that bonds that require less energy to break are more readily dissociated in a plasma. Thus, mono- or dialkoxysilanes having Si—$OPr^i$, or Si—$OBu^s$ or Si—$OBu^t$ groups could result in a higher density of SiO· type radicals relative to those having Si—OMe group in a plasma. Likewise, mono- or dialkoxysilanes having Si-Et, or Si—$Pr^i$, Si-$Bu^s$ or Si-$Bu^t$ groups could result in a higher density of Si· type radicals relative to those having just Si-Me groups in a plasma. Presumably this contributes to the differentiated properties of films deposited using mono- or dialkoxysilanes having Si—$OPr^i$, or Si—$OBu^s$ or Si—$OBu^t$ groups relative to mono- or dialkoxysilanes having Si—OMe. Similarly, this presumably contributes to the differentiated properties of films deposited using mono- or dialkoxysilanes having Si—$Pr_i$, or Si-$Bu^s$ or Si-$Bu^t$ groups relative to mono- or dialkoxysilanes having Si-Me.

Some of advantages over the prior art achieved with mono- or dialkoxysilanes as silicon precursors include, but are not limited to higher mechanical properties, lower cost, ease of synthesis, and in the case of the mono-alkoxysilanes a higher disilylmethylene ($SiCH_2Si$) density.

The following table lists selected mono- or dialkoxysilanes having Formula 1 or 2. The most preferred molecules are those with a combination of alkyl groups selected such that the molecules boiling point is less than 200° C. (preferably less than 150° C.). In addition for optimum performance alkoxy groups may be chosen that form secondary or tertiary radicals upon homolytic bond dissociation (e.g., Si—$R^2$→Si·+$R^2$· or SiO—$R^3$→SiO·+$R^3$·, where $R^2$· and $R^3$· are a secondary or tertiary radical such as the isopropyl radical or the tert-butyl radical). Further, the most preferred mono- or dialkoxysilanes according to the invention include at least one methyl group as $R^1$, $R^2$, $R^4$, or $R^5$.

List of exemplary mono- or dialkoxysilanes having Formula 1 or 2

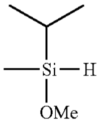

iso-propyl-methyl-methoxysilane (Formula 1)

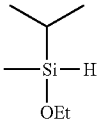

iso-propyl-methyl-ethoxysilane (Formula 1)

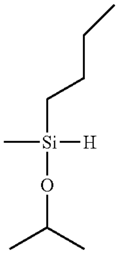

n-butyl-methyl-iso-propoxysilane (Formula 1)

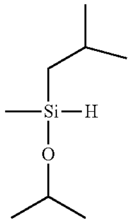

iso-butyl-methyl-iso-propoxysilane (Formula 1)

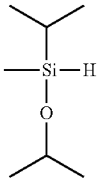

iso-propyl-methyl-isopropoxysilane (Formula 1)

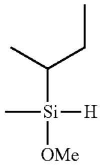

sec-butyl-methyl-methoxysilane (Formula 1)

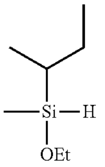

sec-butyl-methyl-ethoxysilane (Formula 1)

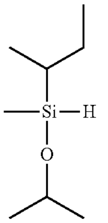

sec-butyl-methyl-iso-propoxysilane (Formula 1)

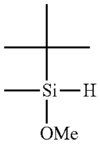

t-butyl-methyl-methoxysilane (Formula 1)

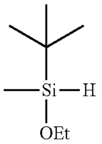

t-butyl-methyl-ethoxysilane (Formula 1)

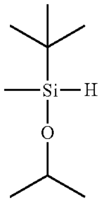

t-butyl-methyl-isopropoxysilane (Formula 1)

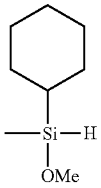

cyclohexyl-methyl-methoxysilane

-continued

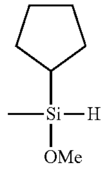

cyclopentyl-methyl-methoxysilane
(Formula 1)

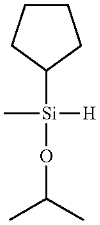

cyclopentyl-methyl-isopropoxysilane
(Formula 1)

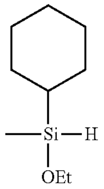

cyclohexyl-methyl-ethoxysilane
(Formula 1)

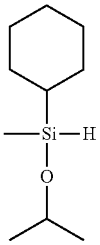

cyclohexyl-methyl-iso-propoxysilane
(Formula 1)

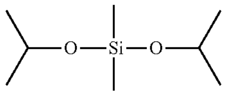

di-iso-propoxy-dimethylsilane
(Formula 2)

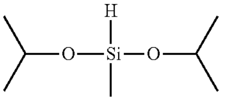

di-iso-propoxy-methylsilane
(Formula 2)

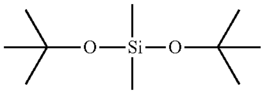

di-t-butoxy-dimethylsilane
(Formula 2)

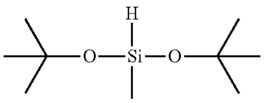

di-t-butoxy-methylsilane
(Formula 2)

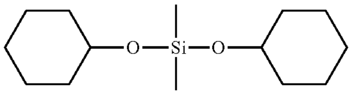

dicyclohexoxy-dimethylsilane
(Formula 2)

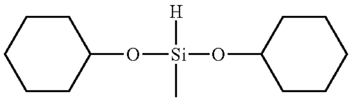

dicyclohexoxy-methylsilane
(Formula 2)

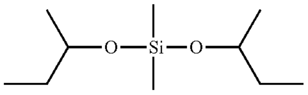

di-sec-butoxy-dimethylsilane
(Formula 2)

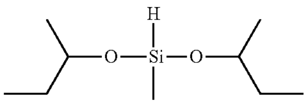

di-sec-butoxy-methylsilane
(Formula 2)

-continued

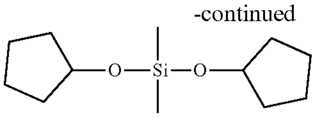

dicyclopentoxydimethylsilane
(Formula 2)

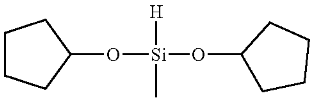

dicyclopentoxymethylsilane
(Formula 2)

The mono- or dialkoxysilanes having Formula 1 or 2 according to the present invention and compositions comprising the mono- or dialkoxysilanes compounds having Formula 1 or 2 according to the present invention are preferably substantially free of halide ions. As used herein, the term "substantially free" as it relates to halide ions (or halides) such as, for example, chlorides (i.e. chloride-containing species such as HCl or silicon compounds having at least one Si—Cl bond such as $Me_2HSiCl$) and fluorides, bromides, and iodides, means less than 50 ppm (by weight) measured by ion chromatography (IC), means less than 10 ppm (by weight) measured by ion chromatography (IC), means less than 5 ppm (by weight) measured by ion chromatography (IC), preferably less than 3 ppm measured by IC, and more preferably less than 1 ppm measured by IC, and most preferably 0 ppm measured by IC. Chlorides are known to act as decomposition catalysts for the silicon precursor compounds having Formula 1 or 2. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The mono- or dialkoxysilanes having Formula 1 or 2 are preferably substantially free of metals or metals such as Li, Na, K, Mg, Ca, Al, Fe, Ni, Cr. As used herein, the term "substantially free" as it relates to such metals or metals means less than 5 ppm (by weight), preferably less than 3 ppm, and more preferably less than 1 ppm, and most preferably 0.1 ppm as measured by ICP-MS. In some embodiments, the silicon precursor compounds having Formulas 1 and 2 are free of metal or metals such as Li, Na, K, Mg, Ca, Al, Fe, Ni, Cr. As used herein, the term "free of" metal impurities as it relates to Li, Na, K, Mg, Ca, Al, Fe, Ni, Cr, means less than 1 ppm, preferably 0.1 ppm (by weight) as measured by ICP-MS or other analytical method for measuring metals. The mono- or dialkoxysilanes having Formula 1 or 2 are also preferably substantially free of water. As used herein, the term "substantially free" as it relates to water content means less than 10 ppm (by weight), preferably less than 5 ppm, and more preferably less than 3 ppm, and most preferably 0.1 ppm as measured by Karl Fisher titration or ICP-MS. In addition, the monoalkoxysilanes having Formula 1 or 2 preferably have purity of 98 wt. % or higher, more preferably 99 wt. % or higher as measured by GC when used as precursor to deposit the organosilica glass ("OSG") films.

The low k dielectric films are organosilica glass ("OSG") films or materials. Organosilicates are employed in the electronics industry, for example, as low k materials. Material properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. The method and composition described herein provides the means to generate low k dielectric films that have a desirable balance of electrical and mechanical properties as well as other beneficial film properties such as sufficient total carbon content and the type of carbon ($Si(CH_3)_x$, $SiCH_2Si$, etc.) to provide improved integration plasma resistance.

In certain embodiments of the method and composition described herein, a layer of silicon-containing dielectric material is deposited on at least a portion of a substrate via a chemical vapor deposition (CVD) process employing a reaction chamber. The method thus includes the step of providing a substrate within a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, tungsten, cobalt, copper, metal alloy, and other metals commonly employed in semi-conductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper, cobalt, and aluminum, and diffusion barrier materials such as, but not limited to, TiN, Ti(C)N, TaN, Ta(C)N, Ta, W, or WN.

The reaction chamber is typically, for example, a thermal CVD or a plasma enhanced CVD reactor or a batch furnace type reactor in a variety of ways. In one embodiment, a liquid delivery system may be utilized. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The method disclosed herein includes the step of introducing into the reaction chamber a gaseous composition comprising mono- or dialkoxysilane. In some embodiments, the composition may include additional reactants such as, for example, oxygen-containing species such as, for example, $O_2$, $O_3$, and $N_2O$, gaseous or liquid organic substances, $CO_2$, or CO. In one particular embodiment, the reaction mixture introduced into the reaction chamber comprises the at least one oxidant selected from the group consisting of $O_2$, $N_2O$, NO, $NO_2$, $CO_2$, water, $H_2O_2$, ozone, and combinations thereof. In an alternative embodiment, the reaction mixture does not comprise an oxidant.

The composition for depositing the dielectric film described herein comprises: from about 40 to about 100 weight percent of mono- or dialkoxysilane.

In embodiments, the gaseous composition comprising the mono- or dialkoxysilane can be used with hardening additives to further increase the elastic modulus of the as deposited films.

In embodiments, the gaseous composition comprising the mono- or dialkoxysilane is substantially free of or free of halides such as, for example, chlorides.

In addition to the mono- or dialkoxysilane, additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide a more stable final film).

Any reagent employed, including the mono- or dialkoxysilane can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor. Preferably, the precursor is delivered into the process vacuum chamber as a gas, that is, the liquid must be vaporized before it is delivered into the process chamber.

The method disclosed herein includes the step of applying energy to the gaseous composition comprising mono- or dialkoxysilane in the reaction chamber to induce reaction of the gaseous composition comprising mono- or dialkoxysilane to deposit an organosilica film on the substrate, wherein the organosilica film has a dielectric constant of from about 2.8 to about 3.3 in some embodiments, 2.90 to 3.3 in other embodiments, and 3.0 to 3.2 in still preferred embodiments, an elastic modulus of from about 7 to about 30 GPa, preferably from 10 to 30 GPa, and an at. % carbon of from about 10 to about 30 as measured by XPS. Energy is applied to the gaseous reagents to induce the mono- or dialkoxysilane and other reactants, if present, to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary rf frequency source can be used to modify the plasma characteristics at the substrate surface. Preferably, the film is formed by plasma enhanced chemical vapor deposition ("PECVD").

The flow rate for each of the gaseous reagents preferably ranges from 10 to 5000 sccm, more preferably from 30 to 3000 sccm, per single 300 mm wafer. The actual flow rates needed may depend upon wafer size and chamber configuration, and are in no way limited to 300 mm wafers or single wafer chambers.

In certain embodiments, the film is deposited at a deposition rate of from about about 5 to about 700 nanometers (nm) per minute. In other embodiments, the film is deposited at a deposition rate of from about 30 to 200 nanometers (nm) per minute.

The pressure in the reaction chamber during deposition typically ranges from about 0.01 to about 600 torr or from about 1 to 15 torr.

The film is preferably deposited to a thickness of 0.001 to 500 microns, although the thickness can be varied as required. The blanket film deposited on a non-patterned surface has excellent uniformity, with a variation in thickness of less than 3% over 1 standard deviation across the substrate with a reasonable edge exclusion, wherein e.g., a 5 mm outermost edge of the substrate is not included in the statistical calculation of uniformity.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583, 049, which is herein incorporated by reference.

The dense organosilica films produced by the disclosed methods, particularly those produced using monoalkoxysilane compounds of Formula (1) as the low k precursor, exhibit good resistance to plasma induced damage, particularly during etch and photoresist strip processes.

The dense organosilica films produced by the disclosed methods exhibit excellent mechanical properties for a given dielectric constant relative to dense organosilica films having the same dielectric constant but made from commercially available prior art structure former precursors such as diethoxymethylsilane (DEMS®) and dimethoxy-dimethylsilane (DMDMOS). The resulting organosilica film (as deposited) typically has a dielectric constant of from about 2.80 to about 3.30 in some embodiments, about 2.90 to about 3.20 in other embodiments, and about 3.0 to about 3.2 in still other embodiments, an elastic modulus of from about 7 to about 30 GPa, and an at. % carbon of from about 10 to about 30 as measured by XPS.

The resultant dense organosilica films may also be subjected to a post treating process once deposited. Thus, the term "post-treating" as used herein denotes treating the film with energy (e.g., thermal, plasma, photon, electron, microwave, etc.) or chemicals to further enhance materials properties.

The conditions under which post-treating are conducted can vary greatly. For example, post-treating can be conducted under high pressure or under a vacuum ambient.

UV annealing is a preferred method conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr. However, a vacuum ambient is preferred for thermal annealing as well as any other post-treating means. The temperature is preferably 200-500° C., and the temperature ramp rate is from 0.1 to 100 deg° C./min. The total UV annealing time is preferably from 0.01 min to 12 hours.

The invention will be illustrated in more detail with reference to the following Examples, but it should be understood that it is not deemed to be limited thereto. It is also recognized that the precursors described in this invention can also be used to deposit porous low k films with similar process advantages relative to existing porous low k films (that is a higher elastic modulus and greater resistance to plasma induced damage for a given value of the dielectric constant).

EXAMPLES

Example 1: Synthesis of iso-propyl-methyl-ethoxysilane (IPMEOS)

Figure 7:
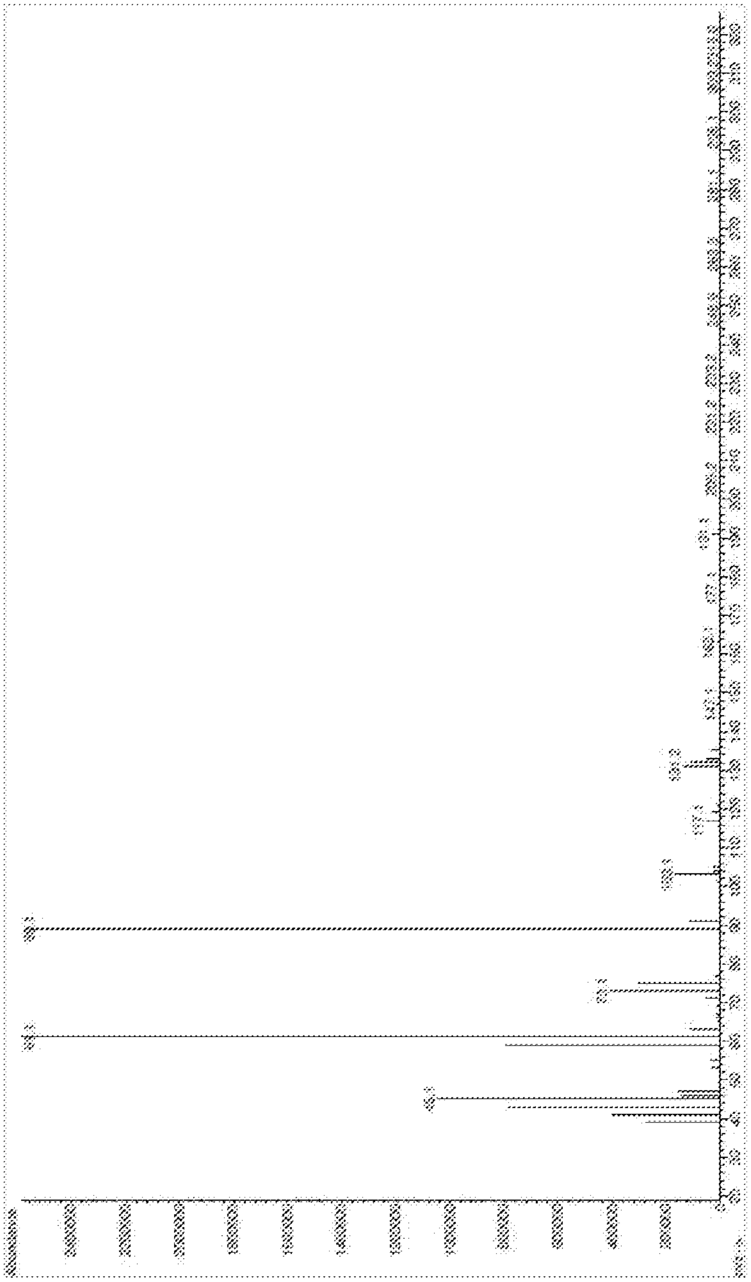
FIG. 7 is a GC-MS chromatogram for iso-propyl-methyl-ethoxysilane as synthesized according to Example 1.

To a three-neck round-bottom flask with thermocouple and condenser was loaded 229.0 g (1.70 mol) diethoxymethylsilane and 1 L of hexanes. 853 mL (1.70 mol) of 2M isopropylmagnesium chloride in THF was added drop-wise and the temperature of the reaction mixture gradually increased to 35° C. The resulting gray slurry was allowed to cool back to room temperature while stirring. Magnesium salt was filtered from the reaction mixture. After the removal of the solvent by distillation, a fractional distillation collected 148 g isopropyl-methyl-ethoxysilane. The yield was 66%. FIG. 7 is a GC-MS chromatogram for isopropyl-methyl-ethoxysilane as synthesized.

Example 2: Synthesis of iso-propyl-methyl-iso-propoxysilane

Figure 8:
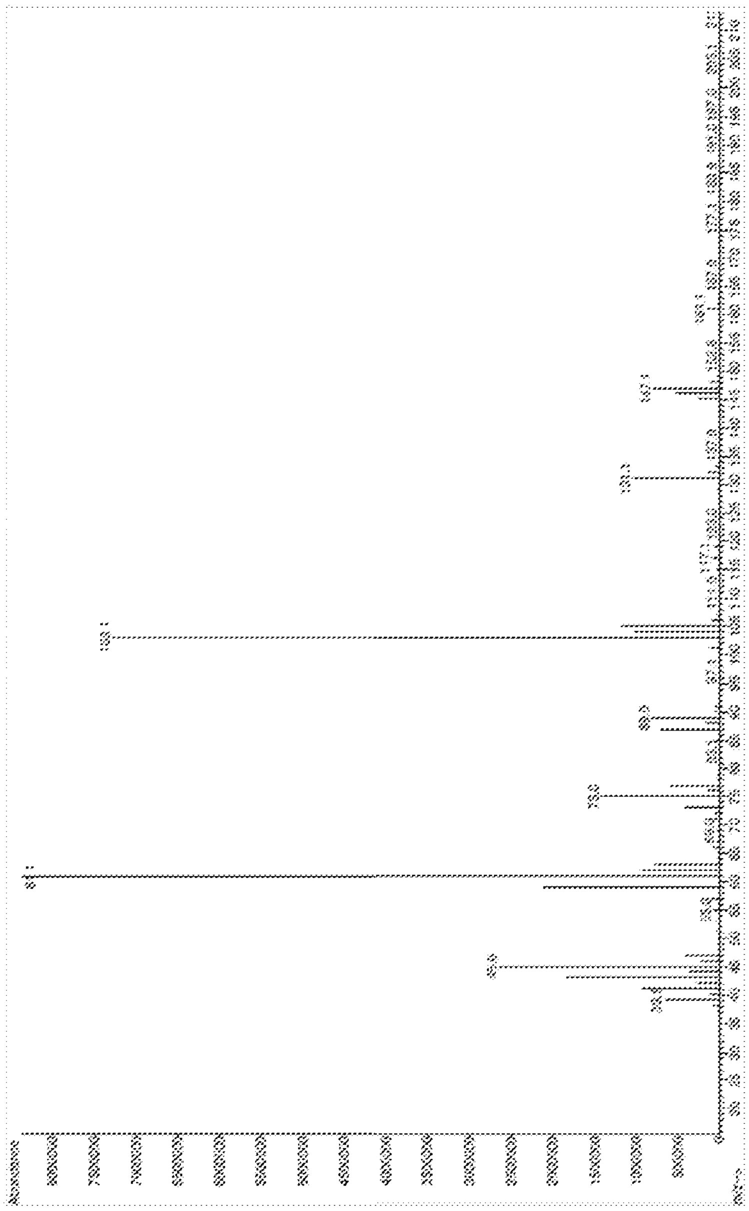
FIG. 8 is a GC-MS chromatogram for iso-propyl-methyl-iso-propoxysilane as synthesized according to Example 2.

To 1.11 g (6.84 mmol) di-iso-propoxy-methylsilane in hexanes was added 3.4 mL (6.84 mmol) 2.0M iso-propylmagnesium chloride in THE dropwise at room temperature. A salt immediately precipitated out and the reaction was slightly exothermic. After two hours of stirring, the salt was allowed to settle to the bottom of the vial. FIG. 8 is a GC-MS chromatogram for iso-propyl-methyl-iso-propoxy-silane as synthesized

Figure 9:
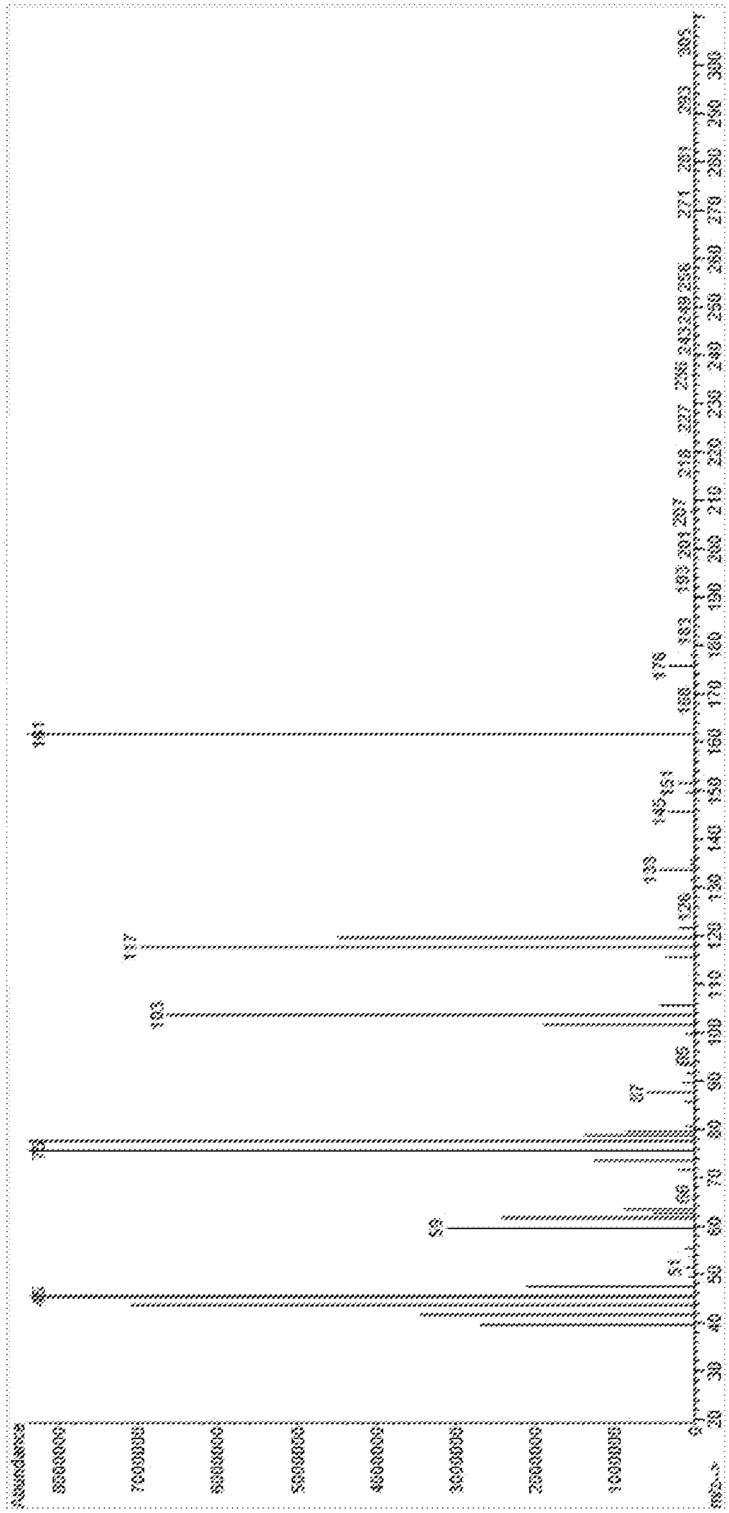
FIG. 9 is a GC-MS chromatogram for di-iso-propoxydimethylsilane as synthesized according to Example 3.

Example 3: Synthesis of di-iso-propoxydimethylsilane 380 g (6.31 mol) isopropyl alcohol was added drop-wise to 327 g (2.53 mol) dichlorodimethylsilane in 500 mL of hexanes at reflux. A nitrogen purge was introduced to purge off HCl. After the addition was completed, refluxing was continued for 1 hour then the reaction was left to cool to room temperature. 30 mL of iso-propylamine was added to drive the reaction to completion. After iso-propylamine hydrochloride was removed by filtration, the crude product was fractional distilled at 88° C. at 180 Torr. 392 g of di-iso-propoxydimethylsilane was obtained at a purity of 99.8%. The yield was 86%. FIG. 9 is a GC-MS chromatogram for di-iso-propoxydimethylsilane as synthesized.

Figure 10:
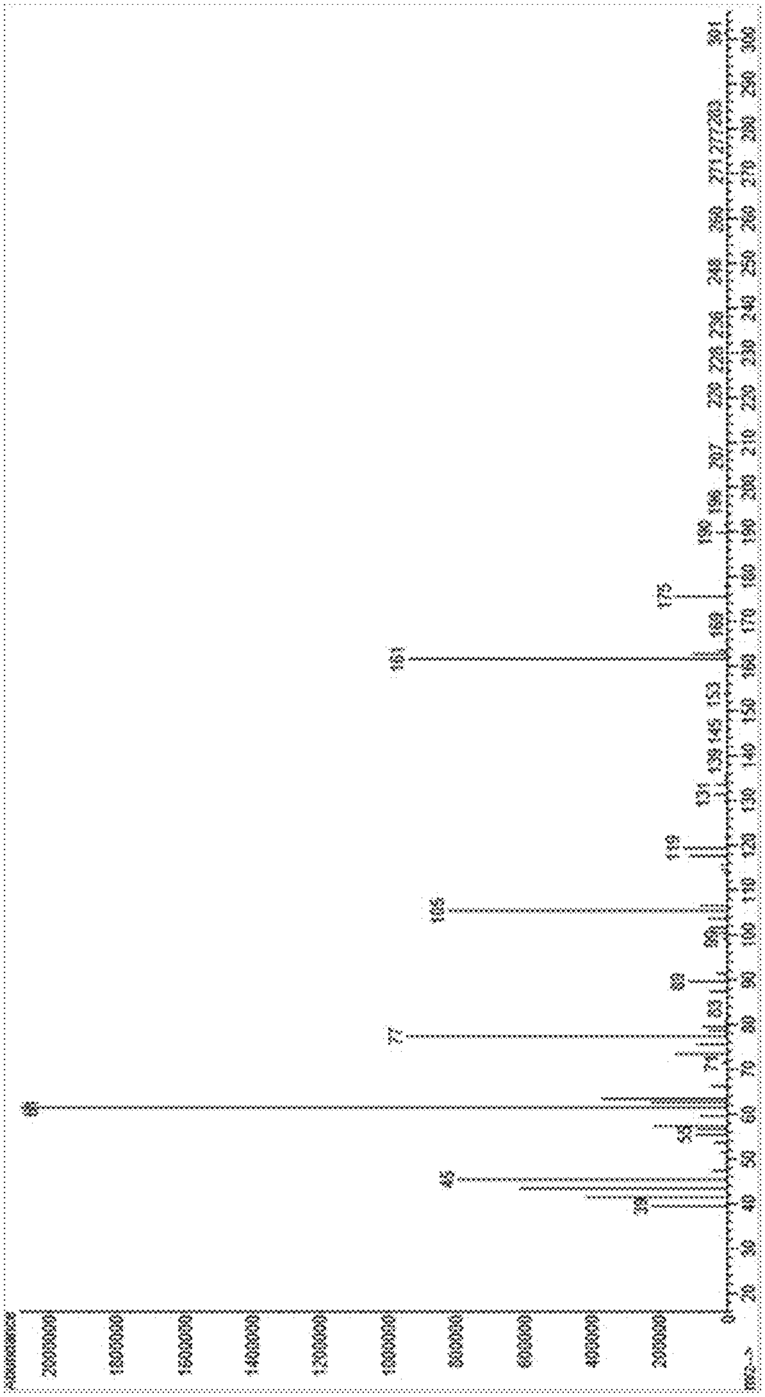
FIG. 10 is a GC-MS chromatogram for di-sec-butoxydimethylsilane as synthesized according to Example 4.

Example 4: Synthesis of di-sec-butoxydimethylsilane 646.0 g (8.72 mol) 2-butanol was added drop-wise to 500.0 g (3.87 mol) dichlorodimethylsilane in 500 mL hexanes at reflux. A nitrogen purge was introduced to purge off HCl. After the addition was completed, refluxing was continued for 1 hour then the reaction was left to cool to room temperature. 162 mL of iso-propylamine was added to drive the reaction to completion. The resulting reaction slurry was filtered and solvent was removed by distillation at atmospheric pressure. A vacuum distillation at 50° C./6 mmHg produced 695.6 g of di-sec-butoxydimethylsilane with a purity of 99.2%. The yield was 88%. FIG. 10 is a GC-MS chromatogram for di-sec-butoxydimethylsilane as synthesized.

Examples 5-8: Synthesis of Additional Dialkoxysilanes having Formula 2

Additional dialkoxysilanes were made via similar fashion as Example 4 and were characterized by GC-MS. The molecular weight (MW), the structure, and corresponding major MS fragmentation peaks of each compound are provided below to confirm their identification.

| Ex. | Precursor Name | MW | Structure | MS Peaks |
|---|---|---|---|---|
| 5 | dicyclohexoxydimethylsilane | 256.46 | 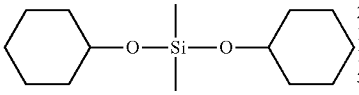 | 256, 241, 213, 173, 159, 131, 115, 101, 75, 55, 45 |
| 6 | dicyclohexoxymethylsilane | 242.43 | 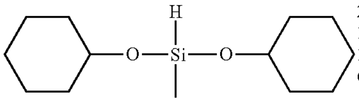 | 242, 227, 199, 171, 159, 143, 117, 99, 71, 61, 55, 45 |
| 7 | dicyclopentoxydimethylsilane | 228.40 | 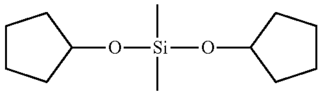 | 228, 213, 199, 159, 145, 101, 75, 55, 45 |
| 8 | dicyclopentoxymethylsilane | 214.38 | 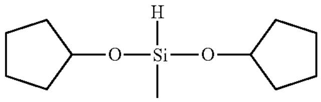 | 214, 213, 199, 185, 157, 145, 129, 117, 99, 77, 67, 61, 41 |

All deposition experiments, including comparative experiments, were performed on a 300 mm AMAT Producer® SE, which deposits films on two wafers at the same time. Thus, the precursor and gas flow rates correspond to the flow rates required to deposit films on two wafers at the same time. The stated RF power per wafer is correct, as each wafer processing station has its own independent RF power supply. The stated deposition pressure is correct, as both wafer processing stations are maintained at the same pressure. The Producer® SE was fitted with a Producer® Nanocure chamber, that was used to UV cure certain films after the deposition process was complete.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also recognized that the compounds disclosed in Formula (1) or Formula (2) in this invention can be used as a structure former for the deposition of porous low k films with a high elastic modulus, a high XPS carbon content, and a high resistance to plasma induced damage.

Thickness and refractive index were measured on a Woollam model M2000 Spectroscopic Ellipsometer. Dielectric constants were determined using Hg probe technique on mid-resistivity p-type wafers (range 8-12 ohm-cm). FTIR spectra were measured using a Thermo Fisher Scientific Model iS50 spectrometer fitted with a nitrogen purged Pike Technologies Map300 for handling 12-inch wafers. FTIR spectra were used to calculate the relative density of bridging disilylmethylene groups or the relative density of terminal silicon methyl groups (Si-Me or $Si(CH_3)_x$, where x is 1, 2, or 3) in the film. The density of terminal silicon methyl groups in the film (i.e., the Si-Me or $Si(CH_3)_x$ density), as determined by infrared spectroscopy, is defined as 1E2 times the area of the $Si(CH_3)_x$ infrared band centered near 1270 $cm^{-1}$ divided by the area of the $SiO_x$ bands between approximately 1250 $cm^{-1}$ to 920 $cm^{-1}$. The relative density of bridging disilylmethylene groups in the film (i.e., the $SiCH_2Si$ density), as determined by infrared spectroscopy, is defined as 1E4 times the area of the $SiCH_2Si$ infrared band centered near 1360 $cm^{-1}$ divided by the area of the $SiO_x$ bands between approximately 1250 $cm^{-1}$ to 920 $cm^{-1}$. Mechanical properties were determined using a KLA iNano Nano Indenter.

Compositional data were obtained by x-ray photoelectron spectroscopy (XPS) on either a PHI 5600 (73560, 73808) or a Thermo K-Alpha (73846) and are provided in atomic weight percent. The atomic weight percent (%) values reported in the table do not include hydrogen.

For each precursor in the examples listed below the deposition conditions were optimized to yield films with high mechanical properties at a dielectric constant of 3.1 or 3.2.

Comparative Example 1: Deposition of a Dense Diethoxymethylsilane (DEMS®) Based Film A dense DEMS® based film was deposited using the following process conditions for 300 mm processing. The DEMS® precursor was delivered to the reaction chamber via direct liquid injection (DLI) at a flow rate of 750 mg/min using 1500 sccm He carrier gas flow, 380 milli-inch showerhead/heated pedestal spacing, 345° C. pedestal temperature, 10 Torr chamber pressure to which a 300 Watt 13.56 MHz plasma was applied. Various attributes of the as deposited film (e.g., dielectric constant (k), elastic modulus and hardness, densities of various functional groups as determined by infrared spectroscopy, and atomic composition by XPS) were obtained as described above and are provided in Table 2.

Comparative Example 2: Deposition of a Dense Dimethyl-dimethoxysilane (DMDMOS) Based Film A dense DMDMOS based film was deposited using the following process conditions for 300 mm processing. The DMDMOS precursor was delivered to the reaction chamber via direct liquid injection (DLI) at a flow rate of 1500 mg/min using 1500 sccm He carrier gas flow, an $O_2$ flow rate of 25 sccm, 380 milli-inch showerhead/heated pedestal spacing, 350° C. pedestal temperature, 7.5 Torr chamber pressure to which a 376 Watt 13.56 MHz plasma was applied. Various attributes of the as deposited film (e.g., dielectric constant (k), elastic modulus and hardness, and densities of various functional groups as determined by infrared spectroscopy) were obtained as described above and are provided in Table 1.

Comparative Example 3: Deposition of a Dense Dimethyl-dimethoxysilane (DMDMOS) Based Film A dense DMDMOS based film was deposited using the following process conditions for 300 mm processing. The DMDMOS precursor was delivered to the reaction chamber via direct liquid injection (DLI) at a flow rate of 2000 mg/min using 1500 sccm He carrier gas flow, an $O_2$ flow rate of 25 sccm, 380 milli-inch showerhead/heated pedestal spacing, 350° C. pedestal temperature, 7.5 Torr chamber pressure to which a 430 Watt 13.56 MHz plasma was applied. Various attributes of the as deposited film (e.g., dielectric constant (k), elastic modulus and hardness, densities of various functional groups as determined by infrared spectroscopy, and atomic composition by XPS) were obtained as described above and are provided in Table 2.

Example 9: Deposition of a Dense Dimethyl-di-iso-propoxysilane (DMDIPOS) Based Film A dense DMDIPOS based film was deposited using the following process conditions for 300 mm processing. The DMDIPOS precursor was delivered to the reaction chamber via direct liquid injection (DLI) at a flow rate of 700 mg/min using 925 sccm He carrier gas flow, an $O_2$ flow rate of 20 sccm, 380 milli-inch showerhead/heated pedestal spacing, 350° C. pedestal temperature, 6.25 Torr chamber pressure to which a 425 Watt 13.56 MHz plasma was applied. Various attributes of the as deposited film (e.g., dielectric constant (k), elastic modulus and hardness, densities of various functional groups as determined by infrared spectroscopy, and atomic composition by XPS) were obtained as described above and are provided in Table 1.

Example 10: Deposition of a Dense Dimethyl-di-iso-propoxysilane (DMDIPOS) Based Film A dense DMDIPOS based film was deposited using the following process conditions for 300 mm processing. The DMDIPOS precursor was delivered to the reaction chamber via direct liquid injection (DLI) at a flow rate of 800 mg/min using 925 sccm He carrier gas flow, an $O_2$ flow rate of 8 sccm, 380 milli-inch showerhead/heated pedestal spacing, 400° C. pedestal temperature, 7.0 Torr chamber pressure to which a 200 Watt 13.56 MHz plasma was applied. Various attributes of the as deposited film (e.g., dielectric constant (k), elastic modulus and hardness, densities of various functional groups as determined by infrared spectroscopy, and atomic composition by XPS) were obtained as described above and are provided in Table 2.

Example 11: Deposition of a Dense Iso-propyl-methyl-ethoxysilane (IPMEOS) Based Film A dense IPMEOS based film was deposited using the following process conditions for 300 mm processing. The IPMEOS precursor was delivered to the reaction chamber via direct liquid injection (DLI) at a flow rate of 1100 mg/min using 900 sccm He carrier gas flow, an $O_2$ flow rate of 8 sccm, 380 milli-inch showerhead/heated pedestal spacing, 390° C. pedestal temperature, 7.5 Torr chamber pressure to which a 270 Watt 13.56 MHz plasma was applied. Various attributes of the as deposited film (e.g., dielectric constant (k), elastic modulus and hardness, and densities of various functional groups as determined by infrared spectroscopy) were obtained as described above and are provided in Table 1.

Example 12: Deposition of a Dense Iso-propyl-methyl-ethoxysilane (IPMEOS) Based Film A dense IPMEOS based film was deposited using the following process conditions for 300 mm processing. The IPMEOS precursor was delivered to the reaction chamber via direct liquid injection (DLI) at a flow rate of 1100 mg/min using 1200 sccm He carrier gas flow, an $O_2$ flow rate of 24 sccm, 380 milli-inch showerhead/heated pedestal spacing, 390° C. pedestal temperature, 7.5 Torr chamber pressure to which a 270 Watt 13.56 MHz plasma was applied. Various attributes of the as deposited film (e.g., dielectric constant (k), elastic modulus and hardness, densities of various functional groups as determined by infrared spectroscopy, and atomic composition by XPS) were obtained as described above and are provided in Tables 2 and 3.

Example 13: Deposition of a Dense UV Cured Isopropyl-methyl-ethoxysilane (IPMEOS) Based Film A dense IPMEOS based film was deposited using the following process conditions for 300 mm processing. The IPMEOS precursor was delivered to the reaction chamber via direct liquid injection (DLI) at a flow rate of 1100 mg/min using 1200 sccm He carrier gas flow, an $O_2$ flow rate of 24 sccm, 380 milli-inch showerhead/heated pedestal spacing, 390° C. pedestal temperature, 7.5 Torr chamber pressure to which a 270 Watt 13.56 MHz plasma was applied. To increase the mechanical properties of the as deposited film, the film was UV cured in the Producer® Nanocure™ chamber at a 400° C. pedestal temperature. The length of the UV cure process was adjusted to maximize the mechanical properties of the film while having little to no impact on the dielectric constant of the film. Various attributes of the UV cured film (e.g., dielectric constant (k), elastic modulus and hardness, densities of various functional groups as determined by infrared spectroscopy, and atomic weight percent carbon (% C)) were obtained as described above and are provided in Table 3.

TABLE 1

Processing conditions for select films with a dielectric constant of 3.2 that were adjusted to obtain a high elastic modulus.

| | Dimethyl-di-iso-propoxysilane (DMDIPOS) | Iso-propyl-methyl-ethoxysilane (IPMEOS) | Dimethyl-dimethoxysilane (DMDMOS) |
|---|---|---|---|
| Power (W) | 425 | 270 | 376 |
| Temperature (° C.) | 350 | 390 | 350 |
| Low k Precursor Flow | 700 | 1100 | 1500 |

TABLE 1-continued

Processing conditions for select films with a dielectric constant of 3.2 that were adjusted to obtain a high elastic modulus.

| | Dimethyl-di-iso-propoxysilane (DMDIPOS) | Iso-propyl-methyl-ethoxysilane (IPMEOS) | Dimethyl-dimethoxysilane (DMDMOS) |
|---|---|---|---|
| (mg/min) | | | |
| He Carrier Gas Flow (sccm) | 925 | 900 | 1500 |
| $O_2$ Flow (sccm) | 20 | 8 | 25 |
| Pressure (Torr) | 6.25 | 7.5 | 7.5 |
| Dielectric Constant | 3.2 | 3.2 | 3.2 |
| Elastic Modulus (GPa) | 27 | 26 | 21 |
| Hardness (GPa) | 4.2 | 3.9 | 3.2 |
| $Si(CH_3)_x$ Density | 1.6 | 2.1 | 2.3 |
| $SiCH_2Si$ Density | 12 | 19 | 13 |
| % C | 22 | | |
| % O | 47 | | |
| % Si | 31 | | |

TABLE 2

Processing conditions for select films with a dielectric constant of 3.1 that were adjusted to obtain a high elastic modulus.

| | Dimethyl-di-iso-propoxysilane (DMDIPOS) | Iso-propyl-methyl-ethoxysilane (IPMEOS) | Diethoxy-methyl-silane (DEMS ®) | Dimethyl-dimeth-oxysilane (DMDMOS) |
|---|---|---|---|---|
| Power (W) | 200 | 270 | 300 | 430 |
| Temp. (° C.) | 400 | 390 | 345 | 350 |
| Low k Precursor Flow (mg/min) | 800 | 1100 | 750 | 2000 |
| He Carrier Gas Flow (sccm) | 925 | 1200 | 1500 | 1500 |
| $O_2$ Flow (sccm) | 8 | 24 | 0 | 25 |
| Pressure (Torr) | 7.0 | 7.5 | 10 | 7.5 |
| Dielectric Constant | 3.1 | 3.1 | 3.1 | 3.1 |
| Elastic Modulus (GPa) | 24 | 23 | 21 | 19 |
| Hardness (GPa) | 3.8 | 3.3 | 3.0 | 2.7 |
| $Si(CH_3)_x$ Density | 1.8 | 2.1 | 2.3 | 2.5 |
| $SiCH_2Si$ Density | 11 | 15 | 11 | 12 |
| % C | 15 | 19 | 19 | 18 |
| % O | 51 | 47 | 46 | 48 |
| % Si | 34 | 34 | 35 | 35 |

TABLE 3

Comparative film properties of as deposited and UV cured k = 3.1 films deposited using Iso-propyl-methyl-ethoxysilane (IPMEOS)

| | k | Elastic Modulus (GPa) | Hard-ness (GPa) | % Carbon | $Si(CH_3)_x$ Density | $SICH_2Si$ Density |
|---|---|---|---|---|---|---|
| Pre UV Treatment (As Deposited) | 3.1 | 23 | 3.3 | 19 | 2.1 | 15 |
| Post UV Treatment | 3.1 | 27 | 3.7 | 18 | 1.5 | 18 |

Figure 2:
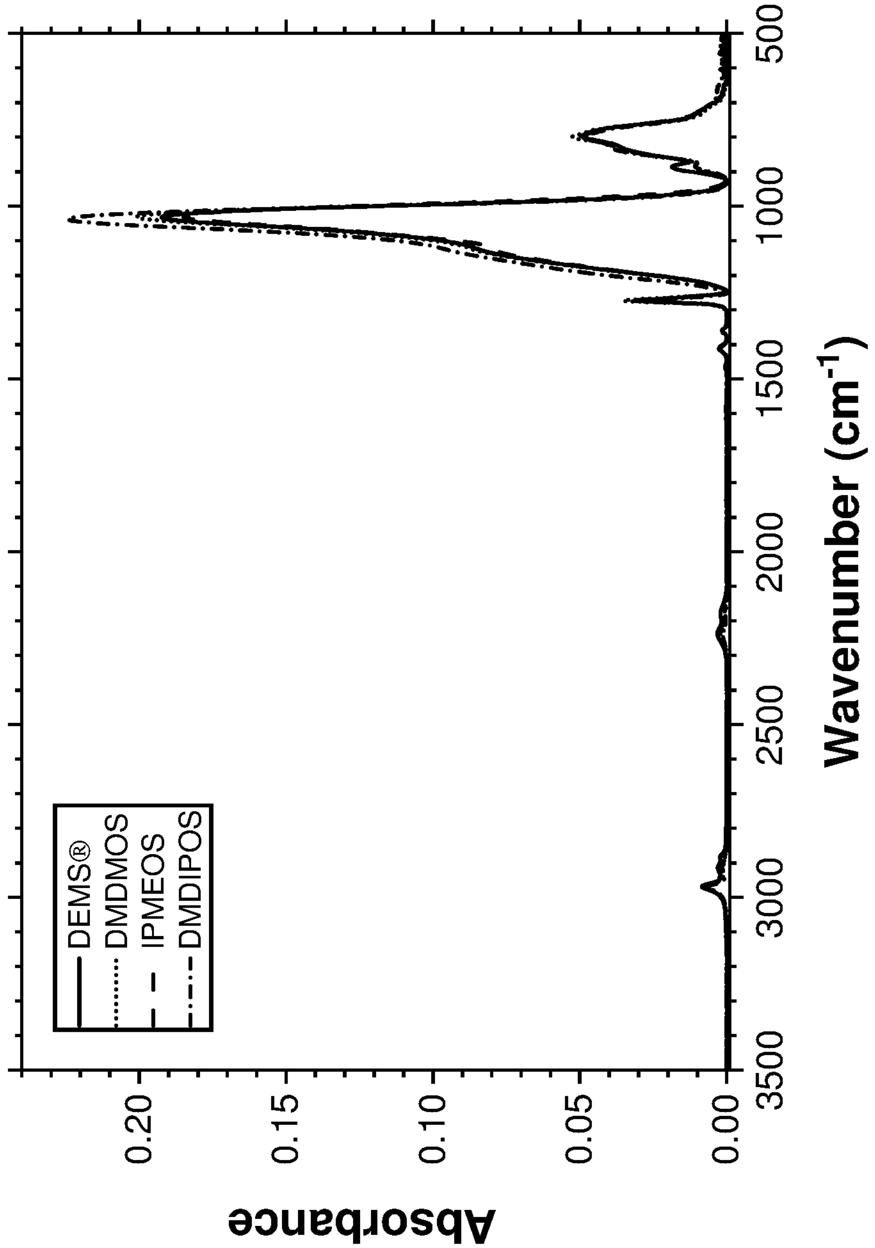
FIG. 2 is a chart depicting IR spectra for low k (3.1) films deposited using dimethyl-di-iso-propoxysilane (DMDIPOS), iso-propyl-methyl-ethoxysilane (IPMEOS), and dimethyl-dimethoxysilane (DMDMOS)

Table 1 shows comparative film properties of k=3.2 films deposited using dimethyl-diisopropoxysilane (DMDIPOS), iso-propyl-methyl-ethoxysilane (IPMEOS)), and dimethyl-dimethoxysilane (DMDMOS). Table 2 shows comparative film properties of k=3.1 films deposited using DMDIPOS, IPMEOS, diethoxy-dimethylsilane (DEMS®), and DMDMOS. The processing conditions for all films in Tables 1 and 2 were adjusted to achieve a high elastic modulus. The infrared spectra of the four films in Table 2 are shown in FIG. 2. These spectra were used to calculate the relative densities of the Si-Me (or $Si(CH_3)_x$) groups and the relative densities of $SiCH_2Si$ groups in each film as described earlier. Similarly, the infrared spectra of the films in Table 1 were used to calculate the relative densities of the $Si(CH_3)_x$ groups and the $SiCH_2Si$ groups in each film as described earlier.

As summarized in Table 1 the films deposited using DMDIPOS and IPMEOS have an unexpectedly high elastic modulus and hardness relative to the DMDMOS based film, all films having a measured dielectric constant of 3.2. Compared to the DMDMOS based film the DMDIPOS and IPMEOS based films have significantly greater mechanical properties and a lower $Si(CH_3)_x$ density. A similar trend is observed in Table 2, where the films deposited using DMDIPOS and IPMEOS have an unexpectedly high elastic modulus and hardness relative to the DEMS® and DMDMOS based films. Compared to the DEMS® and DMDMOS based films the DMDIPOS and IPMEOS based films have significantly greater mechanical properties and lower $Si(CH_3)_x$ densities.

Figure 5:
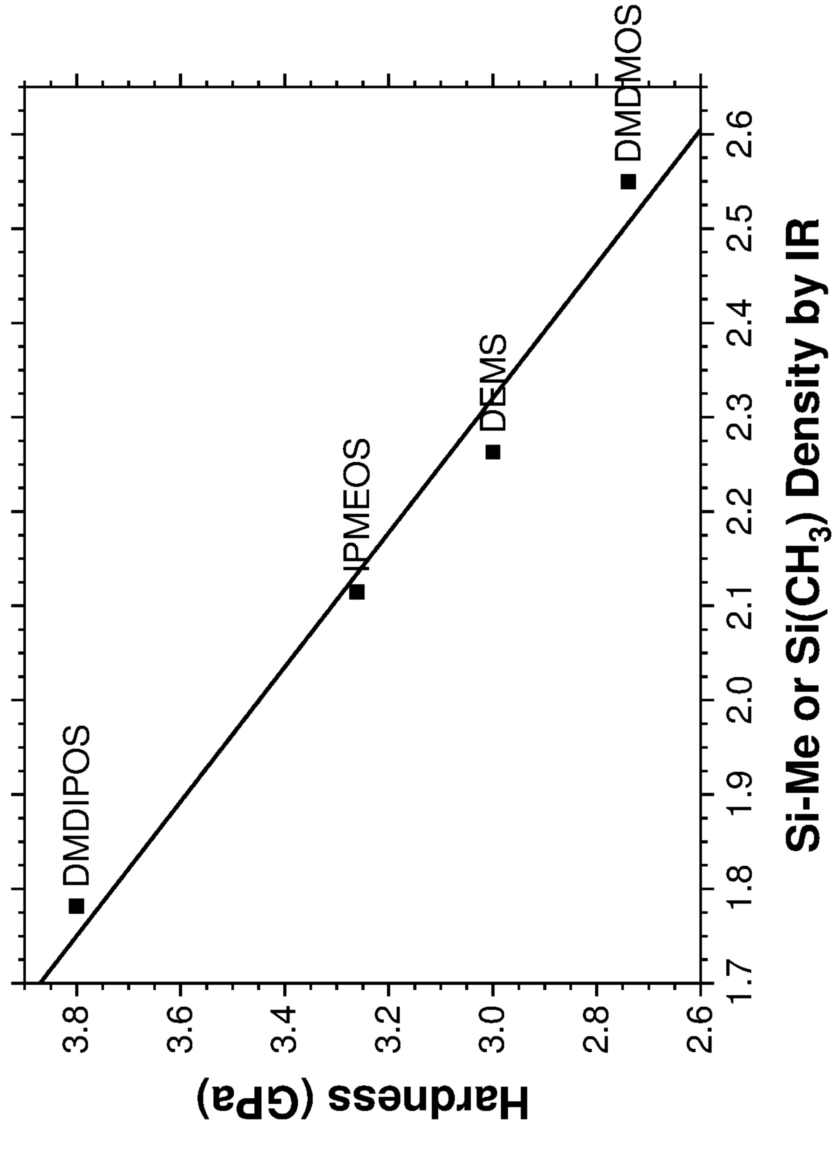
FIG. 5 is a graph depicting terminal silicon methyl density ($Si(CH_3)_x$) as determined by infrared spectroscopy plotted against hardness for dense k=3.1 films deposited using dimethyl-di-iso-propoxysilane, iso-propyl-methyl-ethoxysilane, diethoxy-methylsilane, and dimethyl-dimethoxysilane.

FIG. 5 shows a plot of the relative $Si(CH_3)_x$ density against the hardness of the films in Table 2. The data show that the hardness of the film increases as the $Si(CH_3)_x$ density of the film decreases. The trend of increasing mechanical strength with decreasing silicon methyl density is consistent with behavior previously reported in the literature. However, what is unexpected is that the film deposited from IPMEOS, the mono-alkoxy silane compound of Formula (1), exhibits greater mechanical strength than the film deposited from the dialkoxysilane compound DEMS®, as DEMS® based films are well known for their high mechanical strength. Similarly, it is unexpected that DMDIPOS, the dialkoxysilane compound of Formula (2), exhibits such extremely high mechanical strength relative to the film deposited from DMDMOS as these two precursors are identical, expect for the alkoxy group. It is also unexpected the DMDIPOS based film exhibits the highest mechanical strength of this series of films.

Whereas prior art silicon-containing structure-forming precursors, for example DEMS®, polymerized, once energized in the reaction chamber, to form a structure having an —O— linkage (e.g., —Si—O—Si— or Si—O—C—) in the polymer backbone, it is believed that monoalkoxysilane compounds having the structure of given in Formula (1), such as, for example, the IPMEOS molecule, polymerizes to form a structure where a high percentage of the —O— bridge in the backbone is replaced with a —$CH_2$-methylene or —$CH_2CH_2$-ethylene bridge(s). In films deposited using prior art precursors such as DEMS® and DMDMOS as the structure forming precursor where the carbon exists mainly in the form of terminal Si-Me groups there is a relationship between the % Si-Me (directly related to % C) versus mechanical strength, see for example the modeling work shown in FIG. 1 where the replacement of a bridging Si—O—Si group with two terminal Si-Me groups decreases the mechanical properties because the network structure is disrupted. In the case of monoalkoxysilane compounds having Formula (1) it is believed that the precursor structure is broken during film deposition to form $SiCH_2Si$ or $SiCH_2CH_2Si$ bridging groups. In this manner, one can incorporate carbon in the form of a bridging group so that, from a mechanical strength view, the network structure is not disrupted by increasing the carbon content in the film. Not being bound by theory, this attribute adds carbon to the film, that allows the film to be more resilient to carbon depletion of the dense film from processes such as etching of the film, plasma ashing of photoresist, and $NH_3$ plasma treatment of copper surfaces. Carbon depletion in dense low k films can cause increases in the effective dielectric constant of the film, problem with film etching and feature bowing during wet cleaning steps, and/or integration issues when depositing copper diffusion barriers. While prior art structure formers such as MESCP (1-methyl-1-ethoxy-1-silacyclopentane) deposit can deposit low k films with exceptionally high densities of bridging $SiCH_2Si$ and/or $SiCH_2CH_2Si$ groups, these films also have a very high Si-Me density and total carbon content, that ultimately limits the highest elastic modulus achievable with this class of prior art low k precursors. For example, as taught in U.S. Pat. No. 9,922,818 when optimized for high mechanical properties, the elastic modulus of MESCP based films are similar to those of DEMS® based films at the same value of the dielectric constant.

The processing conditions for depositions of dense low k films deposited using DMDIPOS, IPMEOS, DEMS®, and DMDMOS as the low k precursor on a 300 mm PECVD reactor are given in Table 2. The processing conditions for each of these depositions were adjusted to obtain a high elastic modulus at a dielectric constant of 3.1. The infrared spectra of the dense low k films in Table 1 are shown in FIG. 2. The relative densities of the $Si(CH_3)_x$ groups and the $SiCH_2Si$ groups in each film were calculated from its infrared spectrum as described earlier.

Figure 3:
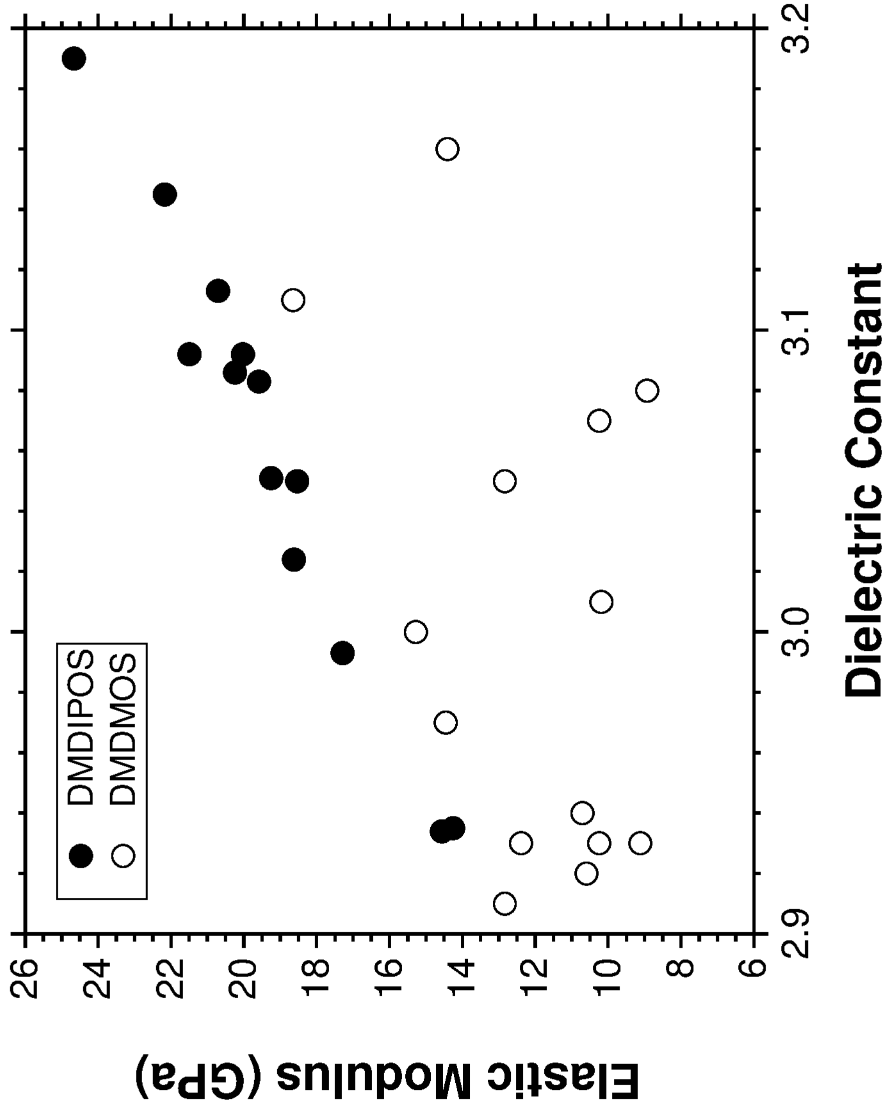
FIG. 3 is a graph depicting a relationship between the elastic modulus of dense dimethyl-di-iso-propoxysilane and dimethyl-dimethoxysilane films having different dielectric constants.

A series of depositions of dense low k dielectric films were deposited using either DMDIPOS or DMDMOS as the low k precursor on a 300 mm PECVD reactor under a variety of process conditions from 230-525 Watts plasma power, 6.25-7.50 Torr chamber pressure, 350-400° C. substrate temperature, 8-125 sccm $O_2$ gas flow, 925-1500 sccm He carrier gas flow, 0.7 to 3.3 g/min of precursor liquid flow, and a 0.380 inch electrode spacing. The elastic modulus was measured by nanoindentation as described herein. FIG. 3 shows the relationship between the elastic modulus of dense DMDIPOS and DMDMOS films having different dielectric constants. As FIG. 3 shows the prior art or DMDMOS low k films have a lower elastic modulus at the same value of the dielectric constant than DMDIPOS based films as the dielectric constant is increased from about 2.9 to about 3.2. This illustrates one of the important advantages of using dialkoxysilane compounds of Formula (2) described herein as DMDIPOS versus other prior art structure formers for depositing a dense low k dielectric film which is for similar values of the dielectric constant, the dialkoxysilane precursor DMDIPOS can be used to deposit films with a higher elastic modulus.

Figure 4:
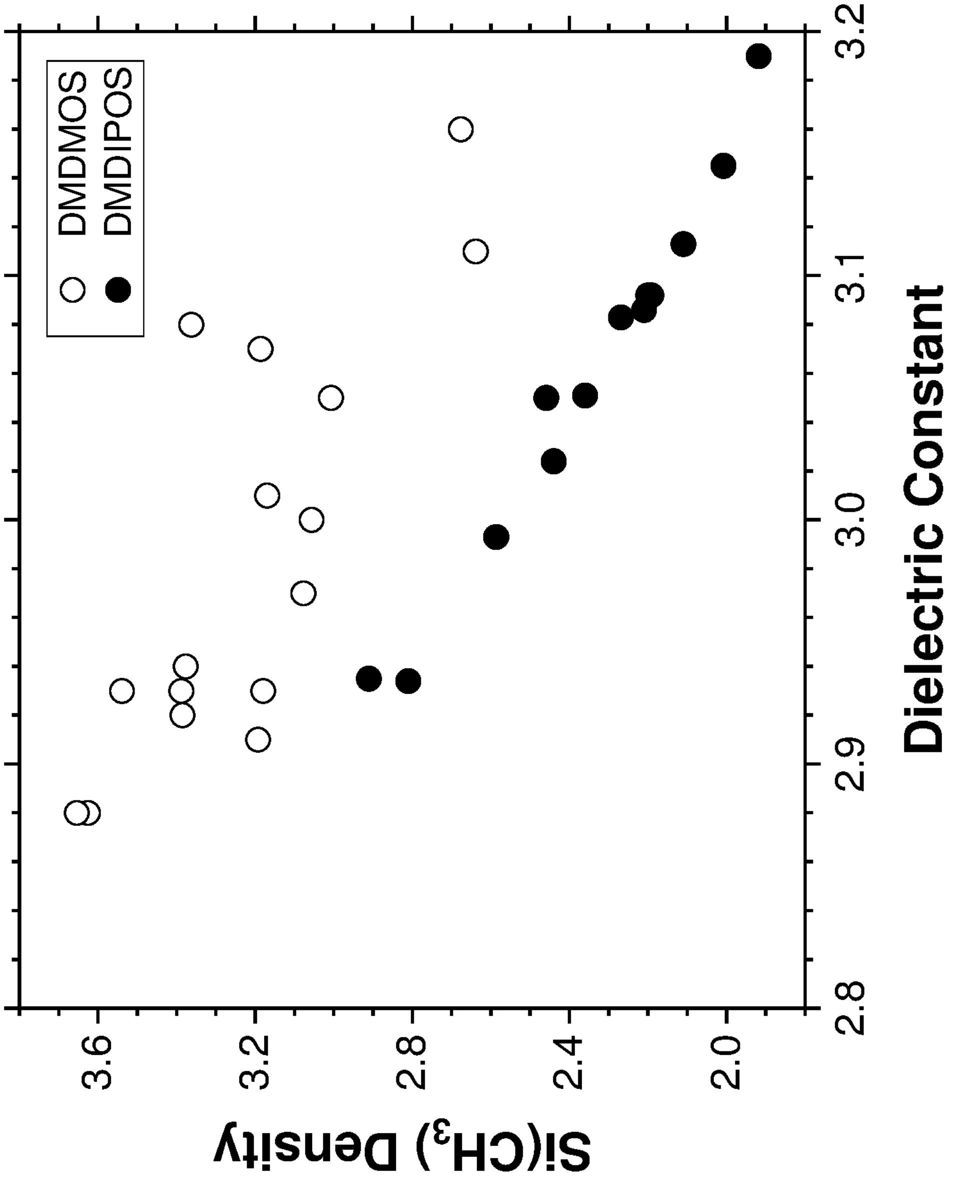
FIG. 4 is a graph depicting a relationship between the density of the $Si(CH_3)$ groups of the dense dimethyl-di-iso-propoxysilane and dimethyl-dimethoxysilane films having different dielectric constants.

A series of depositions of dense low k dielectric films were deposited using either DMDIPOS or DMDMOS as the low k precursor on a 300 mm PECVD reactor under a variety of process conditions from 230-525 Watts plasma power, 6.25-7.50 Torr chamber pressure, 350-400° C. substrate temperature, 8-125 sccm $O_2$ gas flow, 925-1500 sccm He carrier gas flow, 0.7 to 3.3 g/min of precursor liquid flow, and a 0.380 inch electrode spacing. The density of $Si(CH_3)_x$ groups was calculated from the infrared spectra for each film as described herein. FIG. 4 shows the relationship between the density of the $Si(CH_3)_x$ groups of the dense DMDIPOS and DMDMOS films having different dielectric constants. As FIG. 4 shows the prior art or DMDMOS low k films have a higher density of $Si(CH_3)_x$ groups at the same value of the dielectric constant than DMDIPOS based films as the dielectric constant is increased from about 2.9 to about 3.2. This illustrates one of the important advantages of using dialkoxysilane compounds of Formula (2) described herein as DMDIPOS versus other prior art structure formers for depositing a dense low k dielectric film which is for similar values of the dielectric constant, the dialkoxysilane precursor DMDIPOS can be used to deposit films with a lower density of $Si(CH_3)_x$ groups. The lower density of $Si(CH_3)_x$ groups results in dense low k films with increased mechanical properties because less of the network structure is disrupted.

Figure 6:
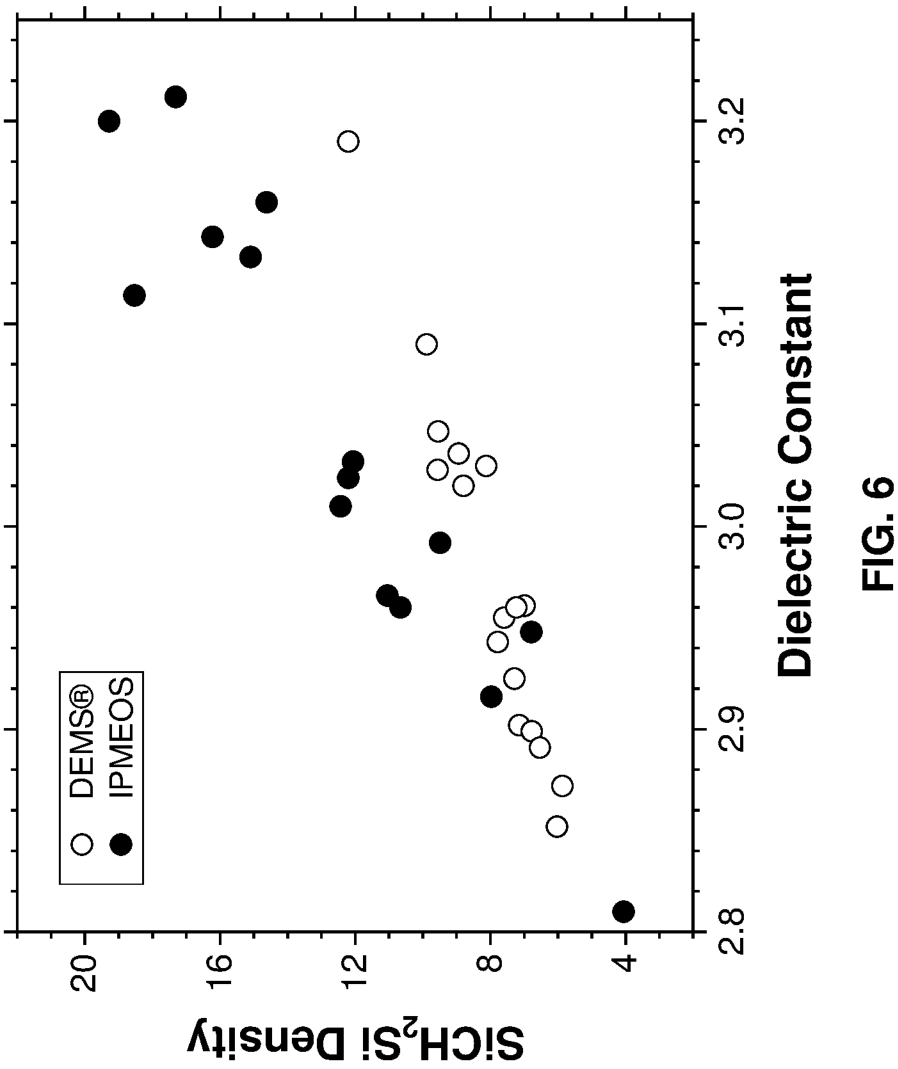
FIG. 6 is a graph depicting a relationship between the density of the $SiCH_2Si$ groups of dense films deposited using iso-propyl-methyl-ethoxysilane and diethoxy-methylsilane and having different dielectric constants.

A series of depositions of dense low k dielectric films were deposited using either IPMEOS or DEMS® as the low k precursor on a 300 mm PECVD reactor under a variety of process conditions from 170-550 Watts plasma power, 7.0-10.0 Torr chamber pressure, 345-390° C. substrate temperature, 0-40 sccm $O_2$ gas flow, 600-2250 sccm He carrier gas flow, 1.1 to 2.5 g/min of precursor liquid flow, and a 0.380 inch electrode spacing. The density of $SiCH_2Si$ groups was calculated from the infrared spectra for each film as described herein. FIG. 6 shows the relationship between the density of the $SiCH_2Si$ groups of the dense IPMEOS and DEMS® films having different dielectric constants. As FIG. 6 shows the prior art or DEMS® low k films have a lower density of $SiCH_2Si$ groups at the same value of the dielectric constant relative to IPMEOS based films as the dielectric constant is increased from about 2.9 to about 3.2. This illustrates one of the important advantages of using mono-alkoxysilane compounds of Formula (1) described herein as IPMEOS versus other prior art structure formers for depositing a dense low k dielectric film which is for similar values of the dielectric constant, the mono-alkoxysilane precursor IPMEOS can be used to deposit films with a higher density of $SiCH_2Si$ groups. In this manner, one can incorporate carbon in the form of a bridging group so that, from a mechanical strength view, the network structure is not disrupted by increasing the carbon content in the film. Not being bound by theory, this attribute adds carbon to the film, that allows the film to be more resilient to carbon depletion of the dense film from processes such as etching of the film, plasma ashing of photoresist, and $NH_3$ plasma treatment of copper surfaces.

It is unexpected that the film deposited from IPMEOS, the mono-alkoxy silane compound of Formula (1), exhibits greater mechanical strength than the film deposited from the well-known commercial dialkoxysilane compound DEMS®, as DEMS® based films are well known for their high mechanical strength. To illustrate, for dense low k films it is recognized that as the number of silicon-alkoxy groups (e.g., Si—$OCH_3$, Si—$OCH_2CH_3$, etc.) in the low k precursor increases and the number of silicon-carbon bonds (e.g., Si—$CH_3$, Si—$CH_2CH_3$, etc.) in the precursor decreases, the dielectric constant and mechanical properties of an as deposited film increase and the carbon content of the film decreases (assuming similar deposition conditions). Thus, films deposited from precursors containing four silicon-alkoxy groups and containing no silicon-carbon bonds per silicon atom in the precursor (e.g., TEOS) have a higher dielectric constant, greater mechanical properties, and less carbon than films deposited from precursors containing three silicon-alkoxy groups per silicon and up to one silicon-carbon bond per silicon (e.g., triethoxysilane or TES and methyl-triethoxysilane or MTES), which in turn have a higher dielectric constant, higher mechanical properties, and less carbon than films deposited from precursors containing two silicon-alkoxy groups and one or two silicon-carbon bonds per silicon (e.g., DEMS® and DMDMOS), which in turn have a higher elastic modulus than films deposited from precursors containing only a single silicon-alkoxy group and up to three silicon-carbon bonds per silicon (e.g., diethyl-methyl-iso-propoxysilane and trimethylsilane). Indeed, in U.S. Pat. No. 8,137,764 this concept was utilized to enhance the mechanical properties of dense low k films by depositing films using a controlled mixture of two different precursors during the deposition process. One precursor (the hardening additive), selected to increase the mechanical properties of the film, contained 3 to 4 silicon oxygen bonder per silicon atom and no silicon-carbon bonds, such as TEOS and triethoxysilane (TES). The second precursor, the low k precursor, contained one or more silicon-carbon bonds, such as DEMS® or DMDMOS. A representative example would be the deposition of a low k film from a blend of TES (50%) and DEMS® (50%). The resulting k=3.17 film deposited from the blend of TES and DEMS® had a higher hardness (1.76 GPa) than a film at a similar value of the dielectric constant deposited only from DEMS® (1.58 GPa). The higher elastic modulus of the low k film deposited from the blend TES and DEMS® was attributed to the higher oxygen content, and presumably lower carbon content, of this film relative to the film deposited only from DEMS®. The increased oxygen content, and decreased carbon content, likely results in better three-dimensional network connectivity, and thus improved mechanical properties. Thus it is unexpected is that the film deposited from IPMEOS, a mono-alkoxy silane compound of Formula (1), exhibits greater mechanical strength than a film deposited from the dialkoxysilane compound DEMS®, particularly as DEMS® based films are well known for their high mechanical strength.

It is instructive to compare the films deposited from DMDIPOS and IPMEOS in Tables 1 and 2. The DMDIPOS based films correspond to films deposited from a dialkoxysilane compound corresponding to Formula (2), while IPMEOS based films correspond to films deposited from a mono-alkoxysilane compound corresponding to Formula (1). In both Table 1 and Table 2 the DMDIPOS based films have higher mechanical properties, lower $Si(CH_3)_x$ densities, and lower $SiCH_2Si$ densities relative to the IPMEOS based films. Thus, in these examples, the films deposited from the dialkoxysilane compound corresponding to Formula (2) have higher mechanical properties, a lower $Si(CH_3)_x$ density, and a lower $SiCH_2Si$ density than films deposited from the mono-alkoxysilane based compound corresponding to Formula (1).

The data in Table 2 show that the IPMEOS based film, a film deposited from a mono-alkoxysilane compound corresponding to Formula (1), has significantly greater mechanical properties than the film deposited from the dialkoxysilane compound DEMS®. This is unexpected as DEMS® based films are well known for their high mechanical strength.

The data in Table 1 and Table 2 show that the IPMEOS based films have the highest carbon content and the highest $SiCH_2Si$ densities relative to films deposited from the three other dialkoxysilane compounds DMDIPOS, DEMS®, and DMDMOS. Thus, films deposited from IPMEOS would be expected to have a greater resistance to PID than the films deposited from DMDIPOS, DEMS®, and DMDMOS. That is, for the same value of the dielectric constant films deposited from mono-alkoxysilane compounds corresponding to Formula (1) would be expected to have a greater carbon content and greater $SiCH_2Si$ density than films deposited from dialkoxysilane compounds corresponding to Formula (2). Thus, for the same value same value of the dielectric constant films deposited from mono-alkoxysilane compounds corresponding to Formula (1) would be expected to have a greater resistance to PID than films deposited from dialkoxysilane compounds corresponding to Formula (2). Films deposited from mono-alkoxysilane compounds corresponding to Formula (1) also exhibit unexpectedly high mechanical strength relative to films deposited from industry standard dialkoxysilane low k precursors such as DEMS® and DMDMOS.

It is recognized that the mechanical strength of the DMDIPOS based film in Table 1 is significantly greater than the mechanical strength of the DMDMOS based film in Table 1. The DMDIPOS based film in Table 1 also has a smaller $Si(CH_3)_x$ density than the DMDMOS based film in Table 1. Similarly, the mechanical strength of the DMDIPOS based film in Table 2 is significantly greater than the mechanical strength of the DMDMOS based film in Table 2. The DMDIPOS based film in Table 2 also has a smaller $Si(CH_3)_x$ density than the DMDMOS based film in Table 2.

The differences in mechanical strength and $Si(CH_3)_x$ density between the DMDIPOS based films and the DMDMOS based films are unexpected as the dimethyl-di-alkoxysilane based DMDIPOS and DMDMOS precursors are identical except for the alkoxy group; in DMDIPOS the alkoxy group is an iso-propoxy (a branched alkoxy group) and in DMDMOS the alkoxy group is methoxy. The prior art has not considered the impact of different alkoxy groups in otherwise identical precursor molecules on the properties of films deposited from these precursors. In the examples above it is clear that the film deposited from the branched isopropoxy derivative (DMDIPOS) has significantly higher mechanical properties and a lower $Si(CH_3)_x$ density relative to films deposited from the non-branched methoxy derivative (DMDMOS). Not to be bound by theory, it is believed that the dialkoxysilanes compounds of Formula (2)

$$R^4R^5Si(OR^6)_2 \quad (2)$$

in this invention can provide stable radicals such as $(CH_3)_2CH\cdot$ and $(CH_3)_3C\cdot$, during plasma enhanced chemical vapor deposition when the R group in the alkoxy group is selected from a linear, branched or cyclic $C_3$ to $C_{10}$ alkyl, preferably propyl, iso-propyl, butyl, sec-butyl, iso-butyl, or tert-butyl which would provide more stable radicals than methyl as disclosed in prior art such as such as $Me_3SiOMe$ or $Me_3SiOEt$ (Bayer, C., et al. "Overall Kinetics of SiOx Remote-PECVD using Different Organosilicon Monomers," 116-119 Surf. Coat. Technol. 874 (1999)). The higher density of stable radicals such as $(CH_3)_2CH\cdot$ and $(CH_3)_3C\cdot$ in the plasma increase the probability of reaction with one or both terminal silicon methyl groups in DMDIPOS. This reduces the density of the terminal silicon methyl groups in the film, resulting in low k films with higher mechanical properties. It is also recognized that a higher density of stable radicals in the plasma may be achieved when the alkyl group $R^5$ in dialkoxysilane compounds of Formula (2) is selected from a branched or cyclic alkyl, such as isopropyl, sec-butyl, t-butyl, or cyclohexyl.

Although the properties described up to this point have all corresponded to as deposited films in the absence of post deposition treatments such as UV curing, significantly higher mechanical properties can be obtained by UV curing the films deposited from monoalkoxysilane compounds of Formula (1) or dialkoxysilane compounds of Formula (2).

To illustrate, the data in Table 3 compare the film properties of an as deposited and UV cured k=3.1 IPMEOS based low k film. The k=3.1 IPMEOS based low k film is the same film described in Table 2. Post UV cure the mechanical properties of the film are increased by approximately 14%, resulting in a film with a dielectric constant of 3.1 and an elastic modulus of 27 GPa, a very high elastic modulus for a low k film with a dielectric constant of 3.1. The UV curing process decreases both the carbon content (by approximately −4%) and the $Si(CH_3)_x$ density (by about −28%) of the film; it also increases the $SiCH_2Si$ density (by about +20%). As the UV curing process likely introduces some small amount of porosity and decreases the total carbon content of the film, films that are UV cured are expected to exhibit less resistance to PID than the corresponding as deposited films.

Compared to commercially available industry standard dialkoxysilane low k precursors such as DEMS® or DMDMOS, films deposited from mono-alkoxysilane compounds corresponding to Formula (1), such as IPMEOS based films, and dialkoxysilane compounds corresponding to Formula (2), such as DMDIPOS based films, have unexpectedly high mechanical properties and lower $Si(CH_3)_x$ densities for the same value of the dielectric constant. Thus, both are suitable for applications where low k films with higher mechanical properties than DEMS® based or DMDMOS based films are required.

While the DMDIPOS based films have higher mechanical properties than the IPMEOS based films, the IPMEOS based films have a higher carbon content, a higher $Si(CH_3)_x$ density, and a higher $SiCH_2Si$ density than DMDIPOS based films at the same value of the k. Thus, IPMEOS based films would be expected to exhibit a greater resistance to PID than DMDIPOS based films. Further, the IPMEOS based films have the highest $SiCH_2Si$ densities in Table 1 and in Table 2. The IPMEOS based film also has the highest carbon content in Table 2. Thus, IPMEOS based films would be expected to exhibit the greatest resistance to PID relative to films deposited from DMDIPOS, DEMS®, or DMDMOS at the same value of the dielectric constant. That is, for the same value of the dielectric constant films deposited using mono-alkoxysilane compounds of Formula (1) would be expected to have a higher carbon content, a higher $Si(CH_3)_x$ density, a higher $SiCH_2Si$ density, and greater resistance to PID relative to films deposited using dialkoxysilane compounds of Formula (2). Thus, mono-alkoxysilane compounds of Formula (1) may be more suitable for applications where both high mechanical strength and strong resistance to PID are required.

It is recognized that benefits afforded the dense low k films deposited using mono-alkoxysilane compounds of Formula (1) or dialkoxysilane compounds of Formula (2) are not limited to dense low k films and may easily be extended to porous low k deposition processes.

The invention claimed is:

1. A method for making a dense organosilica film with improved mechanical properties, the method comprising the steps of:

providing a substrate within a reaction chamber; introducing into the reaction chamber a gaseous composition comprising at least one mono- or dialkoxysilane having the structure given in Formula (1) or (2):

$$HR^1R^2SiOR^3 \quad (1)$$

wherein $R^1$ is methyl, $R^2$ is selected from a branched or cyclic $C_3$ to $C_{10}$ alkyl, and $R^3$ is selected from a linear, branched or cyclic $C_1$ to $C_{10}$ alkyl;

$$R^4R^5Si(OR^6)_2 \quad (2)$$

wherein $R^4$ is hydrogen or methyl, $R^5$ is selected from a linear, branched or cyclic $C_1$ to $C_{10}$ alkyl, and $R^6$ is selected from a linear, branched, or cyclic $C_3$ to $C_{10}$ alkyl, wherein at least one of $R^5$ and Re is either a cyclic $C_3$ to $C_{10}$ alkyl or a branched alkyl and wherein if $R^6$ is iso-propyl or sec-butyl then $R^4$ is methyl; and applying energy to the gaseous composition comprising the at least one mono- or dialkoxysilane in the reaction chamber to induce reaction of the gaseous composition comprising the at least one mono- or dialkoxysilane to deposit an organosilica film on the substrate, wherein the organosilica film has a dielectric constant of from about 2.80 to about 3.30 and an elastic modulus of from about 7 to about 30 GPa.

2. The method of claim 1 wherein the gaseous composition comprising at least one mono- or dialkoxysilane is free of a hardening additive.

3. The method of claim 1 wherein the mono- or dialkoxysilane of Formula (1) or (2) is substantially free of one or more impurities selected from the group consisting of a halide, water, metals, and combinations thereof.

4. The method of claim 1 which is a chemical vapor deposition method.

5. The method of claim 1 which is a plasma enhanced chemical vapor deposition method.

6. The method of claim 1 wherein the gaseous composition comprising at least one mono- or dialkoxysilane comprises at least one oxidant selected from the group consisting of $O_2$, $N_2O$, NO, $NO_2$, $CO_2$, water, $H_2O_2$, ozone, and combinations thereof.

7. The method of claim 1 wherein the gaseous composition comprising at least one mono- or dialkoxysilane does not comprise an oxidant.

8. The method of claim 1 wherein in the applying step the reaction chamber contains at least one gas selected from the group consisting of He, Ar, $N_2$, Kr, Xe, $CO_2$, and CO.

9. The method of claim 1 wherein the organosilica film has a refractive index (RI) of from about 1.3 to about 1.6 at 632 nm and an at. % carbon as measured by XPS of from about 10% to about 30%.

10. The method of claim 1 wherein the organosilica film is deposited at a rate of from about 5 nm/min to about 700 nm/min.

11. The method of claim 8 wherein the organosilica film has a $SiCH_2Si/SiO_x$*1E4 IR ratio of from about 10 to about 30.

12. The method of claim 1 wherein the mono- or dialkoxysilane in the gaseous composition comprises one or more precursors selected from the group consisting of iso-propyl-methyl-methoxysilane, isopropyl-methyl-ethoxysilane, n-butyl-methyl-iso-propoxysilane, iso-butyl-methyl-iso-propoxysilane, isopropyl-methyl-isopropoxysilane, sec-butylmethylmethoxysilane, sec-butylmethylethoxysilane, sec-butylmethyl-iso-propoxysilane, t-butyl-methyl-methoxysilane, t-butyl-methyl-ethoxysilane, t-butyl-methyl-isopropoxysilane, cyclohexyl-methyl-methoxysilane, cyclopentyl-methyl-methoxysilane, cyclopentyl-methyl-iso-propoxysilane, cyclohexyl-methyl-ethoxy silane, cyclohexyl-iso-propoxymethylsilane, di-iso-propoxy-dimethylsilane, dicyclohexoxy-dimethylsilane, dicyclohexoxy-methylsilane, di-sec-butoxy-dimethylsilane, dicyclopentoxydimethylsilane, and dicyclopentoxymethylsilane.

13. The method of claim 1 wherein the mono- or dialkoxysilane in the gaseous composition comprises one or more precursors selected from the group consisting of iso-propyl-methyl-ethoxysilane, iso-propyl-methyl-isopropoxysilane, di-iso-propoxy-dimethylsilane, di-sec-butoxy-dimethylsilane, dicyclohexoxy-dimethylsilane, dicyclohexoxymethylsilane, dicyclopentoxy-dimethylsilane, and dicyclopentoxymethylsilane.

14. The method of claim 1 wherein the organosilica film has an elastic modulus of from about 23 GPa to about 30 GPa.

15. The method of claim 1 wherein the organosilica film has a hardness of from 2.7 GPa up to 3.2 GPa.

* * * * *